United States Patent
Berson

(10) Patent No.: US 7,619,520 B2
(45) Date of Patent: Nov. 17, 2009

(54) RADIO FREQUENCY IDENTIFICATION LABELS AND SYSTEMS AND METHODS FOR MAKING THE SAME

(76) Inventor: William Berson, 9 Huckleberry La., Weston, CT (US) 06883

( * ) Notice: Subject to any disclaimer, the term of this patent is extended or adjusted under 35 U.S.C. 154(b) by 862 days.

(21) Appl. No.: 11/166,784

(22) Filed: Jun. 24, 2005

(65) Prior Publication Data

US 2006/0170436 A1 Aug. 3, 2006

Related U.S. Application Data

(60) Provisional application No. 60/643,851, filed on Jan. 14, 2005.

(51) Int. Cl.
*G08B 13/14* (2006.01)
(52) U.S. Cl. ............... 340/572.1; 340/572.4; 340/10.51; 340/514; 156/277
(58) Field of Classification Search ............... 340/572.1, 340/572.4, 572.5, 10.51, 514; 156/238, 277, 156/384, 272, 385; 53/415, 234, 466; 235/493, 235/472.02; 324/754
See application file for complete search history.

(56) References Cited

U.S. PATENT DOCUMENTS

| | | | |
|---|---|---|---|
| 3,239,815 A | 3/1966 | Martens |
| 3,245,697 A | 4/1966 | Nugent |
| 3,455,577 A | 7/1969 | Kikumoto |
| 3,468,046 A | 9/1969 | Makishima |
| 3,477,156 A | 11/1969 | Naito |
| 3,536,894 A | 10/1970 | Travioli |
| 3,621,249 A | 11/1971 | Kikumoto |
| 3,640,009 A | 2/1972 | Komiyama |
| 3,802,101 A | 4/1974 | Scantlin |
| 3,829,662 A | 8/1974 | Furahashi |
| 3,891,829 A | 6/1975 | Dobras |
| 3,918,029 A | 11/1975 | Lemelson |
| 3,919,447 A | 11/1975 | Kilmer Jr. et al. |
| 4,044,231 A | 8/1977 | Beck et al. |
| 4,210,916 A | 7/1980 | Mansukhani |

(Continued)

FOREIGN PATENT DOCUMENTS

AU 743 556 B2 1/2002

(Continued)

OTHER PUBLICATIONS

"Hitachi Develops RFID Chip for Bank Notes, Documents," IDG News Service, www.IDG.net, (printed on Oct. 12, 2006), pp. 1-6.

(Continued)

*Primary Examiner*—Anh V La
(74) *Attorney, Agent, or Firm*—Kramer Levin Naftalis & Frankel LLP

(57) ABSTRACT

Systems and methods are provided for generating customized labels having electronic circuitry such as RFID circuitry. A printing system generates the label by selectively transfer printing elements (e.g., electronic circuitry, physical components, etc.) and donor layers (e.g., conductive materials, non-conductive materials, etc.) from a ribbon to a receiver (e.g., an item that receives the indicia). In addition, the printing system can program and test the label or indicia thereof, thereby providing the ability to customize each label according to predetermined criteria and to ensure that each label functions properly.

42 Claims, 17 Drawing Sheets

U.S. PATENT DOCUMENTS

| | | |
|---|---|---|
| 4,264,366 A | 4/1981 | Peng |
| 4,312,915 A | 1/1982 | Fan |
| 4,359,633 A | 11/1982 | Bianco |
| 4,417,822 A | 11/1983 | Stein et al. |
| 4,521,861 A | 6/1985 | Logan et al. |
| 4,529,633 A | 7/1985 | Karlsson |
| 4,530,961 A | 7/1985 | Nguyen et al. |
| 4,625,101 A | 11/1986 | Hinks et al. |
| 4,627,819 A | 12/1986 | Burrows |
| 4,647,774 A | 3/1987 | Brisk et al. |
| 4,647,775 A | 3/1987 | Stein |
| 4,708,493 A | 11/1987 | Stein |
| 4,840,496 A | 6/1989 | Elleman et al. |
| 4,840,674 A | 6/1989 | Schwarz |
| 4,888,475 A | 12/1989 | Müllenmeister |
| 4,889,367 A | 12/1989 | Miller |
| 4,910,185 A | 3/1990 | Satake et al. |
| 4,919,542 A | 4/1990 | Nulman et al. |
| 5,036,099 A | 7/1991 | Allen |
| 5,155,080 A | 10/1992 | Elder et al. |
| 5,166,080 A | 11/1992 | Schietinger et al. |
| 5,184,148 A | 2/1993 | Suga et al. |
| 5,259,907 A | 11/1993 | Soules et al. |
| 5,281,261 A | 1/1994 | Lin |
| 5,282,017 A | 1/1994 | Kasindorf et al. |
| 5,294,198 A | 3/1994 | Schlagheck |
| 5,296,887 A | 3/1994 | Zander |
| 5,308,161 A | 5/1994 | Stein |
| 5,315,098 A | 5/1994 | Tow |
| 5,393,148 A | 2/1995 | Berson |
| 5,401,960 A | 3/1995 | Fisun et al. |
| 5,460,451 A | 10/1995 | Wadman |
| 5,568,177 A | 10/1996 | Talvalkar et al. |
| 5,568,555 A | 10/1996 | Shamir |
| 5,571,311 A | 11/1996 | Belmont et al. |
| 5,582,103 A | 12/1996 | Tanaka et al. |
| 5,597,237 A | 1/1997 | Stein |
| 5,597,997 A | 1/1997 | Obata et al. |
| 5,648,650 A | 7/1997 | Sugifune et al. |
| 5,653,844 A | 8/1997 | Abrams |
| 5,686,725 A | 11/1997 | Maruyama et al. |
| 5,701,538 A | 12/1997 | Yasui |
| 5,704,712 A | 1/1998 | Stein |
| 5,709,918 A | 1/1998 | Kimijima et al. |
| 5,814,806 A | 9/1998 | Tanaka et al. |
| 5,861,618 A | 1/1999 | Berson |
| 5,906,678 A | 5/1999 | Fujiyama et al. |
| 5,908,527 A | 6/1999 | Abrams |
| 5,963,662 A | 10/1999 | Vachtsevanos et al. |
| 5,971,276 A | 10/1999 | Sano et al. |
| 5,973,598 A | 10/1999 | Beigel |
| 5,981,040 A | 11/1999 | Rich et al. |
| 6,001,510 A | 12/1999 | Meng et al. |
| 6,019,865 A | 2/2000 | Palmer |
| 6,025,926 A | 2/2000 | Smith et al. |
| 6,027,027 A | 2/2000 | Smithgall |
| 6,039,257 A | 3/2000 | Berson et al. |
| 6,069,190 A | 5/2000 | Bates et al. |
| 6,095,682 A | 8/2000 | Hollander et al. |
| 6,104,291 A | 8/2000 | Beauvillier et al. |
| 6,123,263 A | 9/2000 | Feng |
| 6,130,613 A | 10/2000 | Eberhardt et al. |
| 6,168,081 B1 | 1/2001 | Urano et al. |
| 6,191,851 B1 | 2/2001 | Kirkham et al. |
| 6,203,069 B1 | 3/2001 | Outwater et al. |
| 6,246,326 B1 | 6/2001 | Wiklof et al. |
| 6,255,948 B1 | 7/2001 | Wolpert et al. |
| 6,271,793 B1 | 8/2001 | Brady et al. |
| 6,274,873 B1 | 8/2001 | Outwater et al. |
| 6,280,069 B1 | 8/2001 | Pastrick et al. |
| 6,280,544 B1 | 8/2001 | Fox |
| 6,294,998 B1 | 9/2001 | Adams et al. |
| 6,299,346 B1 | 10/2001 | Shalom et al. |
| 6,309,690 B1 | 10/2001 | Brogger et al. |
| 6,335,686 B1 | 1/2002 | Goff et al. |
| 6,352,751 B1 | 3/2002 | Miles et al. |
| 6,354,501 B1 | 3/2002 | Outwater et al. |
| 6,355,598 B1 | 3/2002 | Takeda et al. |
| 6,471,126 B2 | 10/2002 | Urano et al. |
| 6,481,907 B2 | 11/2002 | Banach et al. |
| 6,486,783 B1 | 11/2002 | Hauslade et al. |
| 6,508,399 B2 | 1/2003 | Sasaki et al. |
| 6,514,367 B1 | 2/2003 | Leighton |
| 6,543,808 B1 | 4/2003 | Mitchell et al. |
| 6,549,176 B2 | 4/2003 | Hausladen |
| 6,557,758 B1 | 5/2003 | Monico |
| 6,561,422 B1 | 5/2003 | Cariffe |
| 6,576,155 B1 | 6/2003 | Barbera-Guillem |
| 6,593,853 B1 | 7/2003 | Barrett et al. |
| 6,610,351 B2 | 8/2003 | Shchegolik et al. |
| 6,610,386 B2 | 8/2003 | Williams et al. |
| 6,612,494 B1 | 9/2003 | Outwater |
| 6,662,430 B2 | 12/2003 | Brady et al. |
| 6,669,093 B1 | 12/2003 | Meyerson et al. |
| 6,677,917 B2 | 1/2004 | Heerden et al. |
| 6,685,094 B2 | 2/2004 | Cameron et al. |
| 6,693,541 B2 | 2/2004 | Egbert |
| 6,700,491 B2 | 3/2004 | Shafer |
| 6,701,605 B2 | 3/2004 | Huffer et al. |
| 6,702,185 B1 | 3/2004 | Zercher |
| 6,712,272 B2 | 3/2004 | Urano et al. |
| 6,741,178 B1 | 5/2004 | Tuttle |
| 6,752,430 B2 | 6/2004 | Holt et al. |
| 6,784,761 B2 | 8/2004 | Takeda et al. |
| 6,793,138 B2 | 9/2004 | Saito |
| 6,857,573 B2 | 2/2005 | Urano et al. |
| 6,857,714 B2 * | 2/2005 | Ream et al. .................... 347/2 |
| 6,874,639 B2 | 4/2005 | Lawandy |
| 7,038,276 B2 | 5/2006 | Ker et al. |
| 7,038,766 B2 | 5/2006 | Kerns et al. |
| 7,044,386 B2 | 5/2006 | Berson |
| 7,079,230 B1 | 7/2006 | McInerney et al. |
| 7,093,767 B2 * | 8/2006 | Faenza et al. ............... 235/493 |
| 7,102,520 B2 | 9/2006 | Liu et al. |
| 7,172,670 B2 * | 2/2007 | Franko, Sr. .................. 156/256 |
| 7,242,996 B2 | 7/2007 | Roesner |
| 7,261,479 B2 | 8/2007 | Barrus et al. |
| 7,267,285 B2 | 9/2007 | Berson |
| 7,407,195 B2 | 8/2008 | Berson |
| 2001/0024160 A1 | 9/2001 | Banach et al. |
| 2001/0030628 A1 | 10/2001 | Brady et al. |
| 2001/0048028 A1 | 12/2001 | Sasaki |
| 2002/0054201 A1 | 5/2002 | Takeda et al. |
| 2002/0056756 A1 | 5/2002 | Cameron et al. |
| 2002/0134842 A1 | 9/2002 | Olivier |
| 2003/0006170 A1 | 1/2003 | Lawandy |
| 2003/0014288 A1 | 1/2003 | Clarke et al. |
| 2003/0062119 A1 | 4/2003 | Hohberger et al. |
| 2003/0146288 A1 | 8/2003 | Berson |
| 2004/0070503 A1 | 4/2004 | Monahan |
| 2004/0141790 A1 | 7/2004 | Water |
| 2004/0175515 A1 | 9/2004 | Lawrence et al. |
| 2004/0175548 A1 | 9/2004 | Lawrence et al. |
| 2004/0175550 A1 | 9/2004 | Lawrence et al. |
| 2004/0200061 A1 | 10/2004 | Coleman et al. |
| 2004/0215350 A1 | 10/2004 | Roesner |
| 2005/0035924 A1 | 2/2005 | Liu et al. |
| 2005/0230962 A1 | 10/2005 | Berson |
| 2006/0086803 A1 | 4/2006 | Berson |
| 2006/0127154 A1 | 6/2006 | Barrus et al. |
| 2006/0163363 A1 | 7/2006 | Berson |
| 2006/0170436 A1 | 8/2006 | Berson |
| 2006/0170557 A1 | 8/2006 | Berson |
| 2006/0171756 A1 | 8/2006 | Berson |

2008/0282593 A1 11/2008 Berson

FOREIGN PATENT DOCUMENTS

| EP | 0535881 | 4/1993 |
|---|---|---|
| EP | 0697673 | 2/1996 |
| JP | 9-161002 | 6/1997 |
| WO | WO 00/16278 | 3/2000 |

OTHER PUBLICATIONS

"Automatic Identification and Data Capture," Bear Stearns & Co., Inc., pp. 1-74, Jun. 2003.

Yoshida, Junko, "Euro Bank Notes to Embed RFID Chips by 2005," *EE Times*, pp. 1-6, Dec. 19, 2001.

Morley, Gearoid, "Radio Frequency ID Tags," Automation Research Centre, University of Limerick, Aug. 2003.

Reynolds, Matt, "The Physics of RFID," *ThingMagic LLC*.

Lee, Youbok, Ph.D., "RFID Tag and COB Development Guide with Microship's RFID Devices,(AN830)" *Microchip Technology, Inc.*, pp. 1-25, 2002.

"World RFID-based Application Markets-A686-11," Frost & Sullivan, Palo Alto, California, 2004.

Collins, Jonathan, "The Cost of Wal-Mart's RFID Edict," RFID Journal, http://www.rfidjournal.com/article/articleview/572/1/1, Sep. 10, 2003.

Roberti, Mark, "Sticker Shock," RFID Journal, http://www.rfidjournal.com/article/articleview/1002/1/2, Jul. 12, 2004.

Roberti, Mark, "$10K and No Takers," RFID Journal, http://www.rfidjournal.com/article/articleview/1270/1/2, Dec. 6, 2004.

"RFID Antennas Webpage of Graphic Solutions International LLC," http://www.grpahicssolutionsinc.com/rfid.htm, Mar. 30, 2007.

"Application Note Radiometric Temperature: Concepts and Solutions," Santa Barbara Infrared, Inc., 30 South Calle Cesar Chavez, Suite D, Santa Barbara, CA, www.SBIR.com.

Fraser III, John A., "The use of Encrypted, Coded and Secret Communications is an Ancient Liberty Protected by the United States Constitution," Virginia Journal of Law and Technology, University of Virgina, vol. 2, Fall 1997.

Roeser and Weasel, "Handbook of Chemistry and Physics," Chenical Rubber Company, 49th Edition, 1968, pp. E-228 and F-76.

Shulman, David, "An Annotated Bibliography of Cryptography," New York, London: Garland Publishing Co., pp. 6-13.

"Thermoelectric Module System Design," INB Products, Inc., http://www.inbthermoelectric.com/thermo.html, Erwin St., Van Nuys, CA 91411, (printed Jul. 12, 2004), p. 1.

"Thermoelectric Module System Design," INB Products, Inc., http://www.inbthermoelectric.com/design.html, Erwin St., Van Nuys, CA 91411, (printed Jul. 12, 2004), pp. 1-3.

"Thermopile Module Low Cost Non Contact Temperature Measurement Technical Data," (Webpage), www.bnbopto.co.kr/sensors/tps/technicaldata1.htm, (printed Oct. 6, 2004), pp. 1-9.

"Understanding Thermopile Infrared Sensors" (Webpage), B+B Corporation South Korea, copyright 2000, www.bnbopto.co.kr/sensors/typs/typs-infor.htm (printed Jul. 12, 2004), pp. 1-5.

Wilkens, John, "Mercury, or the Secret and Swift Messenger," Chapter V, pp. 37-41.

\* cited by examiner

=

+

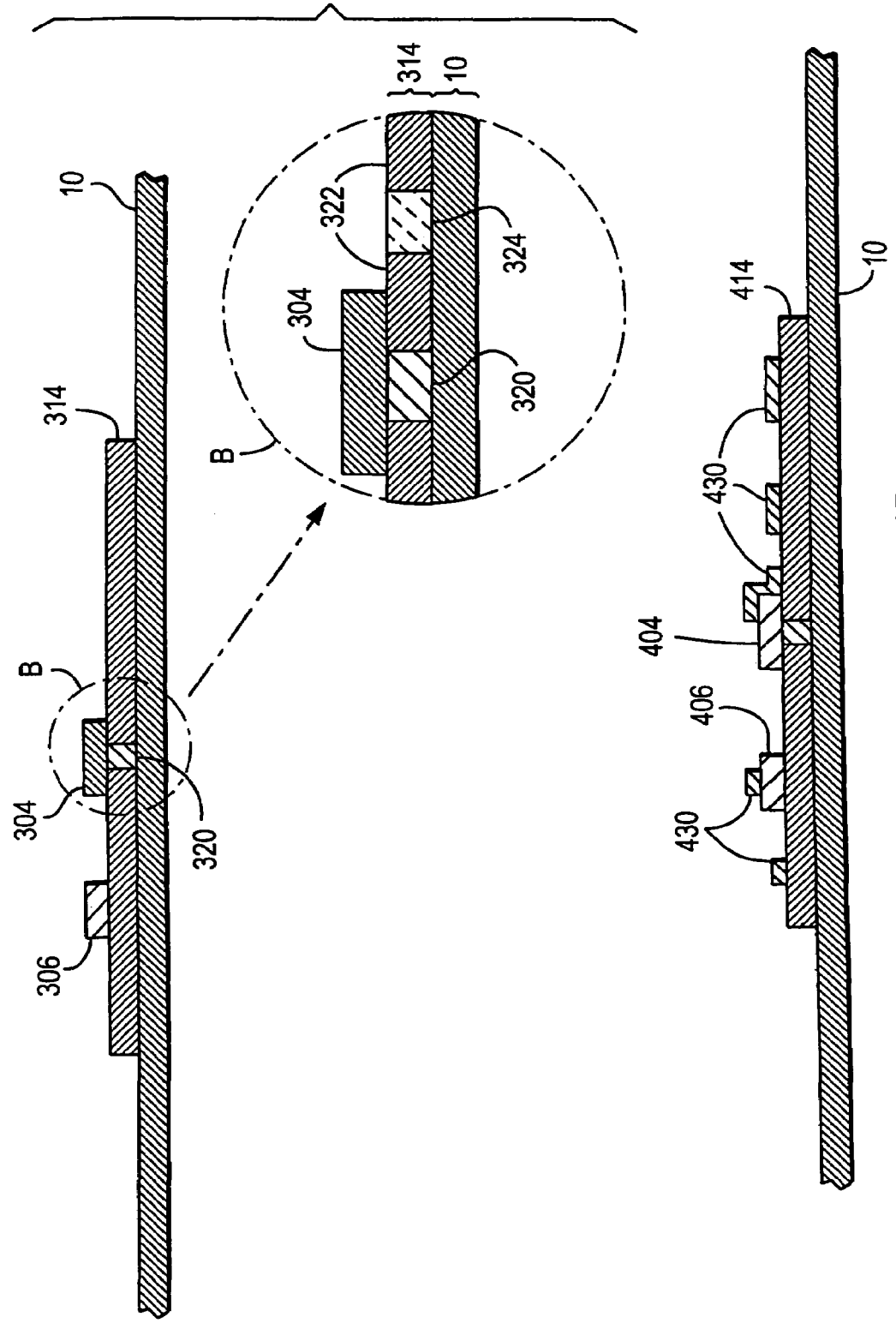

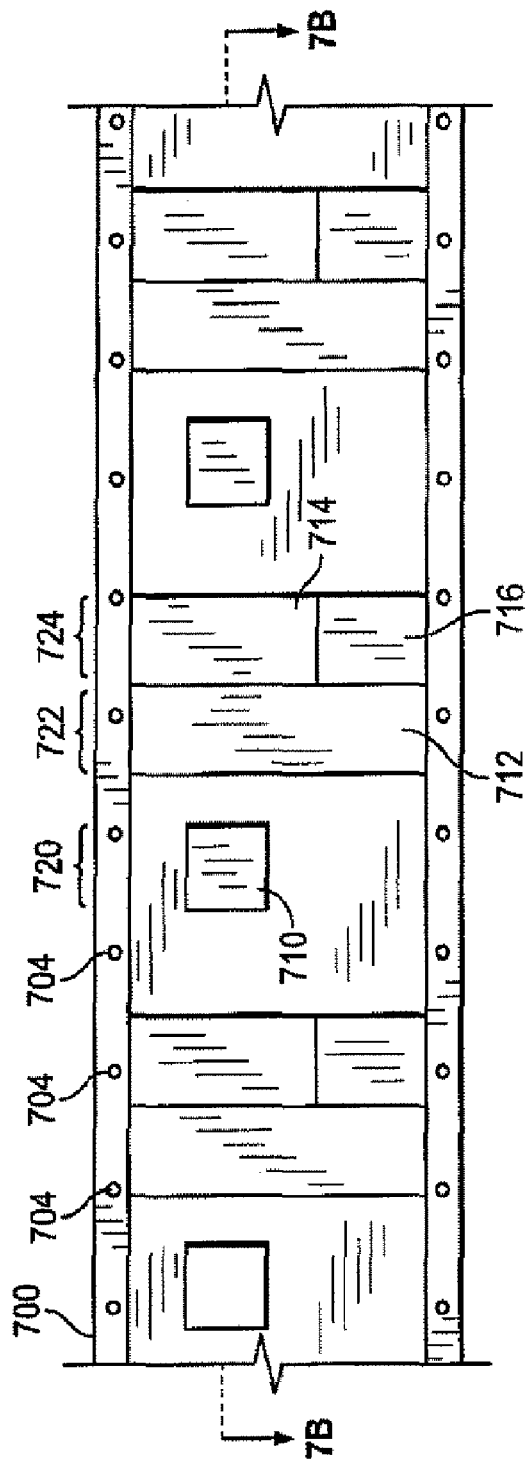
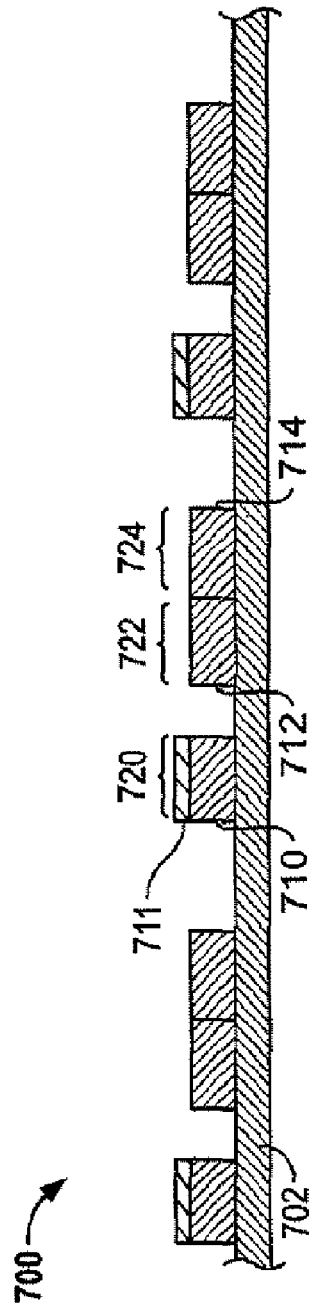
FIG. 7A
FIG. 7B

RADIO FREQUENCY IDENTIFICATION LABELS AND SYSTEMS AND METHODS FOR MAKING THE SAME

This application claims the benefit of U.S. Provisional Application No. 60/643,851, filed Jan. 14, 2005, the disclosure of which is incorporated by reference herein in its entirety.

BACKGROUND OF THE INVENTION

The present invention generally relates to systems and methods for printing indicia. More particularly, the present invention relates to systems and methods for generating customized labels that include indicia such as radio frequency identification (RFID) technology or other electronic circuitry.

RFID technology, which is sometimes referred to in the industry as an RFID chip, RFID device, RFID tag, RFID circuitry, or RFID transponder, is known and used in many different applications. For example, RFID technology can be used in identification, authentication, or tracking applications. As another example, RFID technology can be used in place of, or in addition to, machine readable indicia such as bar codes and other printed media.

RFID technology may include circuitry (e.g., micro-circuitry) that provides a signal including predetermined data. This predetermined data may, for example, identify an item on which the RFID technology is affixed. In other approaches, the data may represent a code, such as electronic product code, that may specify a product manufacturer, a product name, and a serial number. Furthermore, the data may be written in a product markup language (e.g., an extensible markup language).

RFID technology may provide the predetermined data actively or passively. In active applications, the RFID circuitry may independently provide the predetermined data. That is, a power source (e.g., battery) powers the RFID circuitry and enables the RFID circuitry to transmit the data. Actively operating RFID circuitry may continuously transmit its data until its power source is drained or it may transmit its data for a predetermined period of time in response to receiving an activation signal. In passive applications, the RFID circuitry may receive and be powered by an activation signal or an interrogation signal. The activation or interrogation signal may excite or power the RFID circuitry, causing it to provide its data while it is receiving the activation signal. Thus, in passive applications, there is no need for the RFID circuitry to be powered by a power source such as a battery.

RFID technology offers advantages over known bar coding or other printed identification techniques. For example, RFID may allow manufacturers, packagers, wholesalers, distributors, retailers, or any other person or entity that contributes to a supply or distribution chain of products for the marketplace to more accurately maintain records of their inventory to a degree that was previously not possible. For example, assume that a distributor ships a pallet of 1000 widgets, each of which are labeled with RFID technology, to a retailer. When the retailer receives the pallet, he can verify that all 1000 widgets are received using his RFID sensing circuitry.

Although RFID offers many advantages, RFID technology is subject to several drawbacks. One drawback is that RFID is more expensive than bar coding and printed identification techniques. That is, RFID, unlike bar coding, may require circuitry to (actively or passively) provide a radio frequency signal, which carries predetermined data (that may be used to identify an item). In addition, in order for the RFID technology to provide predetermined data in a radio frequency signal, the circuitry may require customization or programming. Thus, the cost associated with RFID technology includes production cost of the circuitry, the programming cost, and affixing cost. While production costs may be expected to decrease as volumes increase, the programming and affixing costs are not as elastic. That is, such costs may remain relatively fixed or may depend on the distribution process (e.g., processes used by distributors to affix RFID tags to items), the supply and demand of, for example, items being tagged with RFID technology, and other factors.

Unlike bar codes and other printed codes, known systems cannot create customizable label having RFID technology on demand. For example, a distributor or retailer is not able to locally create and program the RFID technology at the point of sale or use. This limitation hampers the flexibility and use of RFID, thereby contributing to its higher costs.

Another drawback often experienced with RFID technology is that the operational range may be limited unless an antenna is used. An antenna may extend the transmission range of an RF signal transmitted by the RFID or it may extend the range in which the RFID can receive signals (similar to how an antenna improves or extends the operating range of a transistor radio). Moreover, the antennas may require customization to meet the requirements of the RFID technology.

Further still, another drawback with conventional systems that produce RFID technology is that there may be no mechanism for testing whether the RFID technology is functioning properly.

Therefore, in view of the foregoing, it is an object of the present invention to provide systems and methods to produce customizable tags or labels including RFID technology that alleviate the above and other problems with existing RFID technology and methods and systems for making the same.

SUMMARY OF THE INVENTION

These and other objects of the present invention are accomplished in accordance with the principles of the present invention by providing systems and methods that generate customized labels having electronic circuitry such as RFID circuitry. The printing system according to the invention generates labels according to the invention by selectively transfer printing indicia from a ribbon to a receiver (e.g., an item that receives the indicia). Indicia, as defined herein, refers to anything that can be transfer printed from a ribbon to form part of a label. For example, indicia may include elements (e.g., electronic circuitry, physical components, etc.) and donor layers (e.g., conductive materials, non-conductive materials, etc.). In addition, the printing system can program and test various indicia, thereby providing the ability to customize each label according to predetermined criteria and to ensure that each label functions properly.

The ribbon may include the indicia (e.g., elements and donor layers) that are used to produce labels according to the present invention. The indicia (e.g., elements and donor layers) may be arranged in predetermined positions on the ribbon such that the printing system can control the feed of the ribbon and selectively transfer print indicia (e.g., elements and donor layers) to a receiver. The ribbon may include guide elements that enable the printing system to monitor the feed of the ribbon to ensure that the indicia are accurately transfer printed to the receiver. Print transferring may include thermal transfer printing, which uses application of heat to effect transfer of a portion of the ribbon to the receiver, or pressure transfer printing, which uses application of pressure to transfer a portion of the ribbon to the receiver.

An advantage of using a ribbon according to the invention is that it greatly improves flexibility in generating customized labels and minimizes costs over prior art systems. For example, by combining elements (e.g., RFID circuitry, power sources, etc.) with donor layers (e.g., conductive materials, etc.), the printing system can selectively transfer print elements and interconnect those transferred elements by transfer printing, for example, a conductive donor layer. If desired, a custom made antenna may be produced by selectively transfer printing one or more donor layers. Moreover, if the ribbon includes an optical donor layer, that layer may be transfer printed onto the receiver or on top of elements or other donor layers to provide a machine readable or human readable markings.

Costs are further reduced and label customization is further enhanced by providing "on-the-fly" or on-demand programming and testing of the electronic circuitry (e.g., RFID circuitry) that forms part of the label produced by the printing system. Programming and testing of the electronic circuitry may be performed before the electronic circuitry is transfer printed (e.g., residing on the ribbon), during transfer printing, or after the electronic circuitry is transfer printed. Programming may cause the electronic circuitry to store and transmit predetermined data (e.g., product name, manufacturer name, serial number, etc.) that may be specific to each label. Testing may be performed to test whether the electronic circuitry (e.g., transmits the correct data) and whether the label, itself, is functioning properly (e.g., all electrical connections have been properly transfer printed).

An advantage of the present invention is that the generation, including transfer printing, programming, and testing, of the label may be performed at various points during the manufacture, distribution, or sale of an item. For example, a parts manufacturer may tag parts using the printing machine according to the invention with RFID technology and send those parts to a distributor. The distributor may ship the parts to a retailer (e.g., a retail store) and use the printing machine to label the pallet or boxes containing those parts. The retailer, upon receipt of the parts, may use the printing machine to individually label the parts.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIGS. 3A and 3B show different views of a more detailed illustration of a label that is in accordance with the principles of the present invention;

FIGS. 4A and 4B is the same as the label shown FIGS. 3A and 3B, but includes an additional optical layer that is in accordance with the principles of the present invention;

FIGS. 7A and 7B show different views of a more detailed illustration of a ribbon in accordance with the principles of the present invention;

DETAILED DESCRIPTION OF THE INVENTION

Figure 1:
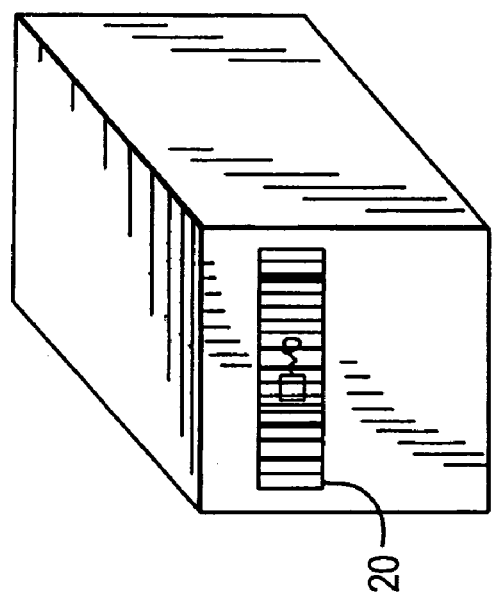
FIG. 1 shows an illustrative arrangement in which customized labels including electronic circuitry according to the invention can be used in accordance with the principles of the present invention.
Figure 1:
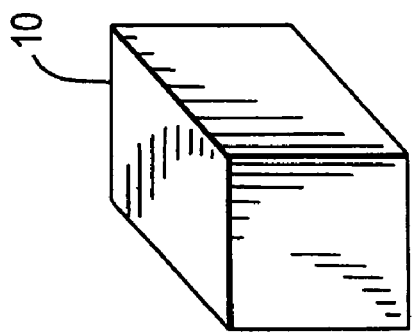
Figure 1:
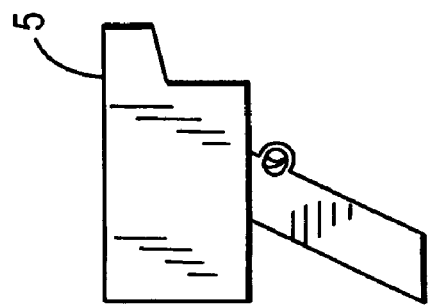

FIG. 1 shows an illustrative arrangement in which a customized label according to the invention can be used in accordance with the principles of the present invention. For example, FIG. 1 may represent a point in a distribution chain (e.g., manufacturer site, distributor site, or retailer site) in which labels can be affixed to a receiver. As shown in FIG. 1, printing machine 5 may be used to print label 20 (e.g., such as labels 200, 300, 400, and 500 shown in FIGS. 2-5 and described in more detail below) onto receiver 10. Printing system 5 is constructed in accordance with the principles of the present invention to generate label 20 on demand and customize it to meet a predetermined set of criteria. Printing system 5 may include an input source (not shown) that permits, for example, a user to input the parameters or specifications of the label to be printed, electronic circuitry (not shown) for executing processes to generate the label, and a display device (not shown) for displaying information. The methods and apparatus or system for printing labels is described in more detail below in connection with FIGS. 6-15.

Receiver 10 represents a black box abstraction of any item capable of receiving and retaining label 20 that is printed onto the item by printing system 5. Examples of receives may include, but are not limited to, items with surfaces such as paper, cardboard, wood, plastic, metal, fabric, textiles, or a TYVEC™ (sheet of high-density polyethylene fibers). Other examples of receivers may include drivers licenses, passports, postmarks, postage meter indicia, postage stamps, labels, authenticity seals or labels, certificates of authenticity, visas, price tags, inventory control tags, access control cards, personal identification badges, product packaging, pallet tags, anti-counterfeiting labels, currency, patient identification cards, labels and tags and similar items.

Label 20 represents a customized label that may be produced by printing system 5. Label 20 may be produced to fulfill many different design criteria, ranging from relatively simple to relatively complex. For example, in one embodiment, label 20 includes an electronic device such as RFID circuitry. In another embodiment, label 20 may include RFID circuitry, a battery, an antenna, conductors, and printed indicia. A more detailed explanation of label 20 according to the invention is discussed below in connection with FIGS. 2-5.

It is understood that the depictions of printing system 5 and receiver 10 are merely illustrative. Thus, although printing system 5 is depicted as a handheld device, it is not limited as such. For example, printing system 5 may be an industrial printing system that prints labels at a high capacity.

Figure 2:
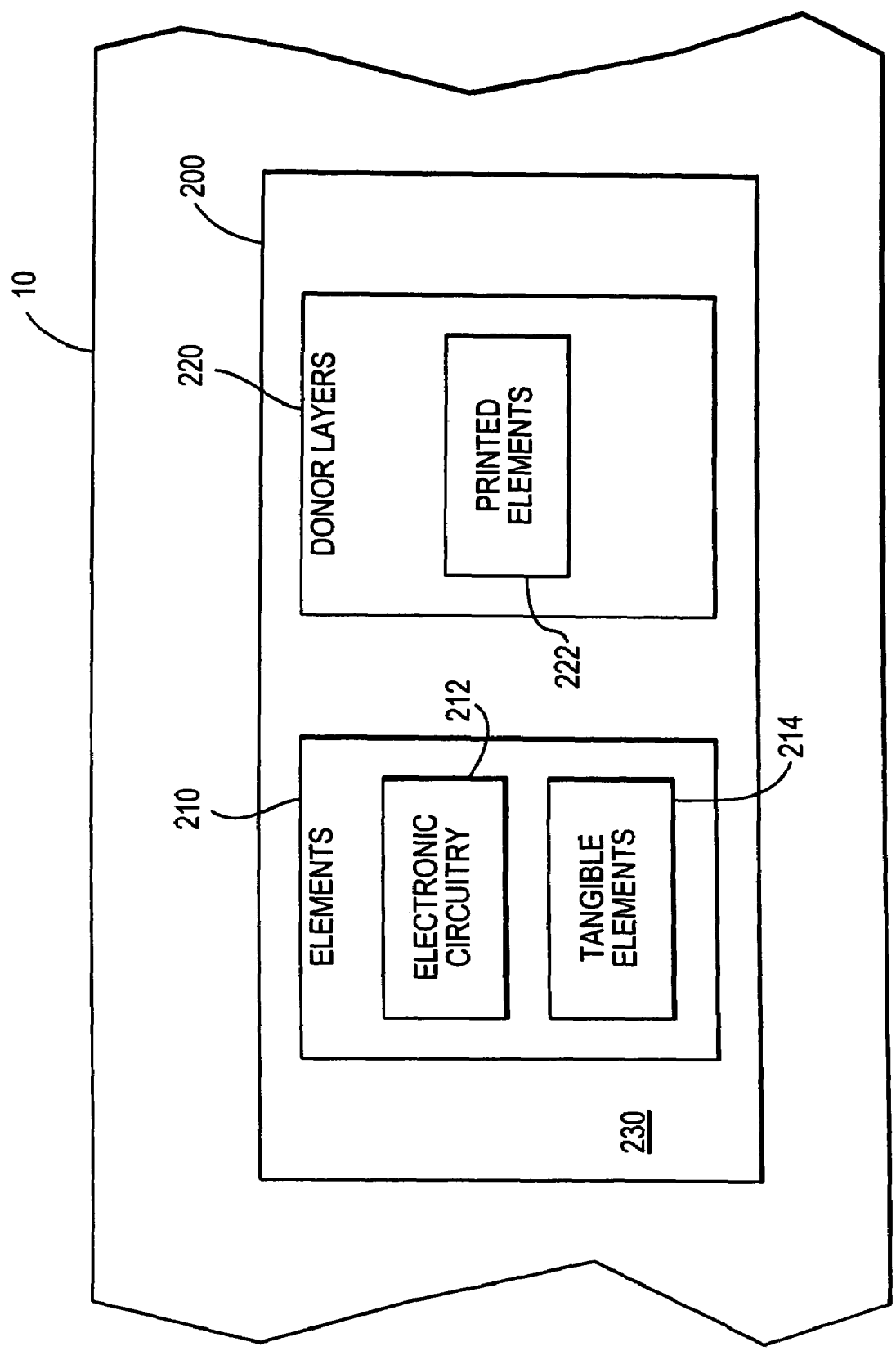
FIG. 2 shows a block diagram illustrating various elements and materials that may be included on a label in accordance with the principles of the present invention.

FIG. 2 shows a block diagram illustrating various elements and materials that may be included on label 200 in accordance with the principles of the present invention. As shown, label 200 may include elements 210, donor layers 220, and substrate 230. Note that elements 210, donor layers 220, and substrate 230 may be collectively referred to as indicia. Elements 210, donor layers 220, and substrate 230 may be transfer printed from a source (e.g., ribbon) to receiver 10 using transfer printing according to the present invention. For example, a ribbon such as ribbon 600 and 700 shown in FIGS. 6 and 7 may include elements 210 and donor layers 220. During printing, elements 210 and donor layers 220 are selectively transfer printed from the ribbon to the receiver to produce the desired label. Note that although ribbon 600 (of FIG. 6) does not include substrate 230, per se, it will be understood that substrate 230, as it resides on label 200, may be formed from a combination of elements 210 and/or donor layers 220 that are transfer printed from the ribbon to receiver 10. In an alternative embodiment, certain elements 210 may reside on receiver 10 prior to printing, and donor layers and other elements 210 may reside on the ribbon.

Elements 210 may include any element having a predefined or tangible existence (e.g., physical structure and/or functional existence) prior to being involved with any transfer printing in accordance with the principles of the present invention. Thus, elements 210 that are transfer printed onto receiver 10 are substantially the same both before and after printing. Examples of such elements may include electronic circuitry 212 and tangible elements 214. Electronic circuitry 212 may include RFID circuitry, such as model number MCRF452 available from Microchip Technology, Inc., of Chandler, Ariz., transponder circuitry, nanotechnology circuitry, discrete electronic circuitry, analog circuitry, digital circuitry, processor circuitry, or any other circuitry. Tangible elements 214 may include batteries, antennas, conductors, holograms, tokens, or any other physical elements.

Donor layers 220 may include one or more suitable materials (e.g., conductive and non-conductive materials) that are transfer printed onto the receiver 10 in one or more predetermined patterns. Donor layers 220 may reside in a field or region of donor layers on, for example, a ribbon (such as ribbon 700 of FIG. 7) before being transfer printed on to receiver 10. During printing, the transfer printing process according to the invention precisely transfer prints a predetermined pattern of the donor layer residing on the ribbon to the receiver 10. Thus, any predetermined pattern of donor materials (or combination of donor material) may reside on receiver 10. This ability to transfer print a predetermined pattern is somewhat akin to the operation of a typewriter. In a typewriter, a key strike causes a mechanical arm, having a key member, to strike a ribbon, which contains ink, thereby causing a pattern of ink corresponding to the key member to be transferred to a piece of paper. The ink on the paper is analogous to the donor layer residing on receiver 10.

Donor layers 220 may include different types of material having different properties. For example, conductive materials, non-conductive materials, and materials having optical properties may be used. If desired, materials having both conductive and optical properties may be used or materials having both non-conductive and optical properties may be used. An example of a donor layer 220 that can be used with label 200 may include waxes such as paraffin, montan, bees wax, vegetable wax, candeilla wax, polyolefins, polar emulsive polyethylene waxes or other materials. Examples of polyethylene waxes are the PED waxes by Hoechst AG of Frankfurt, Germany.

Donor layers 220 may include printed elements 222, which are elements generated using the transfer printing process according to the principles of the present invention. Printed elements 222, as defined herein, are any elements having a predefined or tangible existence (e.g., physical structure and/or functional existence) that are derived as a product of transfer printing in accordance with the principles of the present invention. That is, printed elements 222 do not have the predefined or tangible existence until after selective portions of a donor layer are transfer printed to receiver 10. For example, printed elements 222 may exist in a first state before the printing process, but exist in a second, desired, state on label 200 after the printing process. More particularly, the composition of printed elements 222 may exist as a particular layer of ink on the ribbon, but after the printing process, a predetermined pattern of the ink layer is transferred from the ribbon to receiver 10, thereby rendering printed elements 222 in their desired, second state. This transition in states is somewhat akin to the transition of ink during operation of a typewriter. That is, the ink on the ribbon is in a first state (e.g., a continuous layer of ink) prior to a key strike, but after the key strike, the ink from the ribbon is in a second state (e.g., a letter on the paper). Printed elements 222, as they exist on label 200, may include conductors, antennas, insulators, printed paraphernalia, contact nodes (e.g., to enable programming and testing of the label or indicia residing thereon), and any other suitable structure.

Substrate 230 may be ubiquitous as to its presence on label 200. That is, substrate 230 may include a mixture of materials and components and may provide a medium through which elements 210 and donor layers 220 may be fixed to receiver 10. Thus, substrate 230 may function as the "backbone" of label 200, supporting elements 210 and donor layers 220. For example, elements 210 and donor layers 220 may reside on top of substrate 230. Alternatively, substrate 230 may include, for example, adhesive materials for fixing elements 210 to receiver 10, elements 210, donor layers 220, or a combination thereof. In one embodiment, donor layers 220 (e.g., conductive donor layers and a non-conductive donor layers) may be transferred to receiver 10 to form substrate 230. In this embodiment, it will be understood that such a substrate may electrically interconnect elements 210 via printed elements 222 that form the substrate.

Figure 3A:
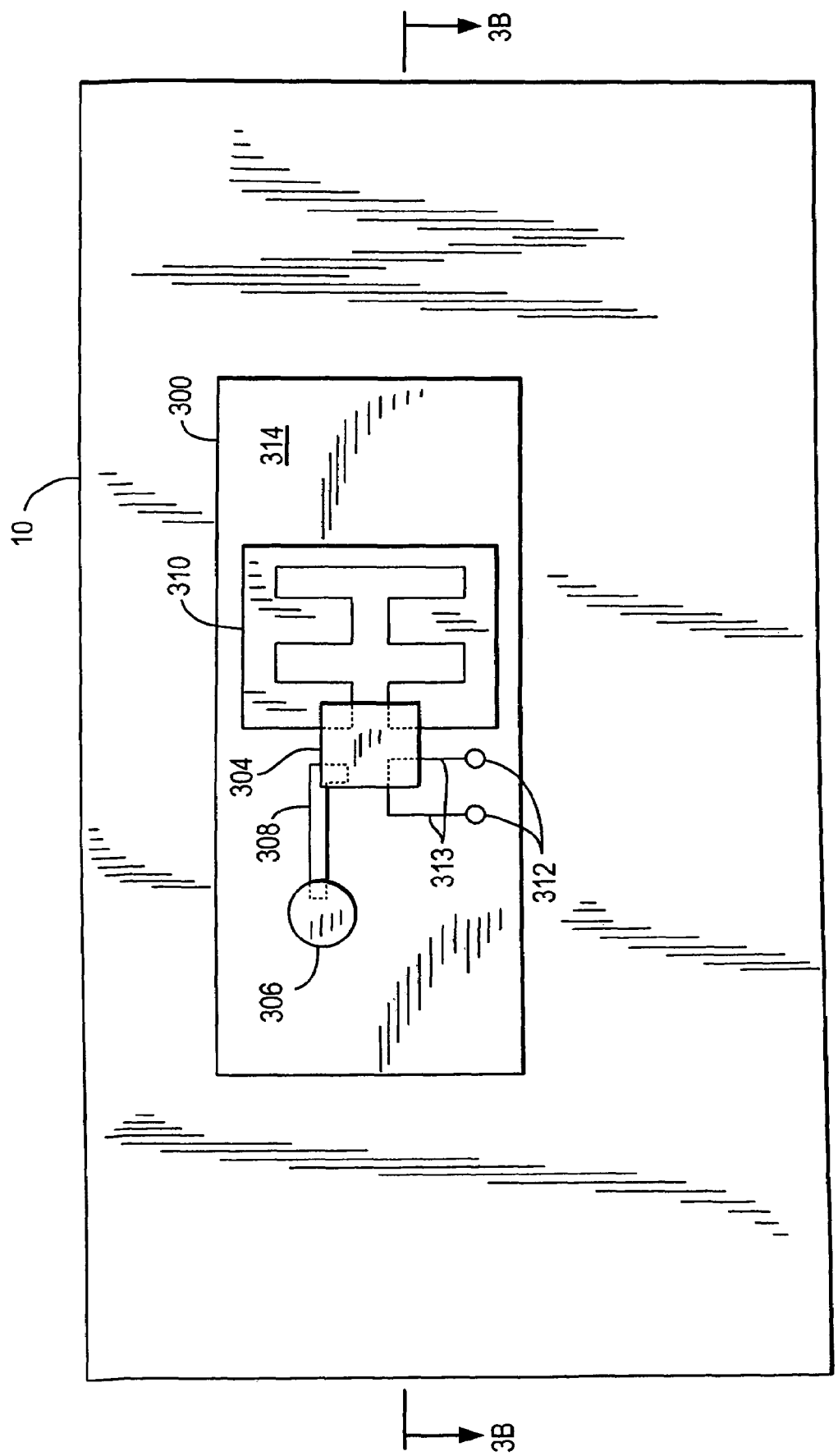

FIG. 3A shows a top view of an embodiment of label 300 that is in accordance with the principles of the present invention. FIG. 3B shows a cross-sectional view of label 300 taken along lines A-A in FIG. 3A in accordance with the principles of the present invention. The following discussion of label 300 is made with reference to both FIGS. 3A and 3B. As shown in the top view, label 300 is disposed on top of receiver 10 and includes electronic circuitry 304 (e.g., RFID circuitry), battery 306 (e.g., a tangible element), conductor 308, antenna 310, contacts points 312, conductors 313, and substrate 314. Conductor 308, antenna 310, contacts points 312, and conductors 313 are printed elements (e.g., printed elements 222) that are printed from a donor layer of a source (e.g., a ribbon) and may form part of substrate 314, as shown in the cross-sectional view.

Conductor 308 electrically couples battery 306 to electronic circuitry 304. This coupling enables power to be supplied to electronic circuitry 304. Conductors 313 electrically couple contact points 312 to electronic circuitry 304. Antenna 310 is also electrically coupled to electronic circuitry 304 printed onto receiver 10 in a predetermined pattern such that it is electrically coupled to electronic circuitry 304. Antenna 310 may be printed in such a way that it is directly coupled to electronic circuitry 304, thereby avoiding the need to print conductors to electrically couple electronic circuitry 304 to antenna 310. However, it will be understood that, if desired, conductors may be printed to couple antenna 310 to electronic circuitry 304. Contact points 312 are printed at a desired location on receiver 10 and conductors 313 may be printed to electrically couple contact points 312 to electronic circuitry 304.

Referring now to FIG. 3B, substrate 314 generally represents the portion of label 300 that includes conductors 308 and 313, antenna 310, and contact points 312. Substrate 314 may also include adhesive layer 320, which may be used to affix electronic circuitry 304 to receiver 10. Another adhesive layer (not shown) may be used to affix battery 306 to receiver 10. Although substrate 314 includes several different elements (e.g., the conductors, antennas, and contact points), not all of the printed elements are shown to avoid overcrowding the figure. The detail section of a portion of FIG. 3B taken from circle B, however, does show different regions of substrate 314. For example, regions 322 may represent conductive regions of substrate 314, which includes antenna 310, and region 324 may represent a non-conductive region of substrate 314. Note the portion of region 322 ext3ending beneath electronic circuitry 304 may represent an electrical coupling between antenna 310 and electronic circuitry 304.

Figure 4A:
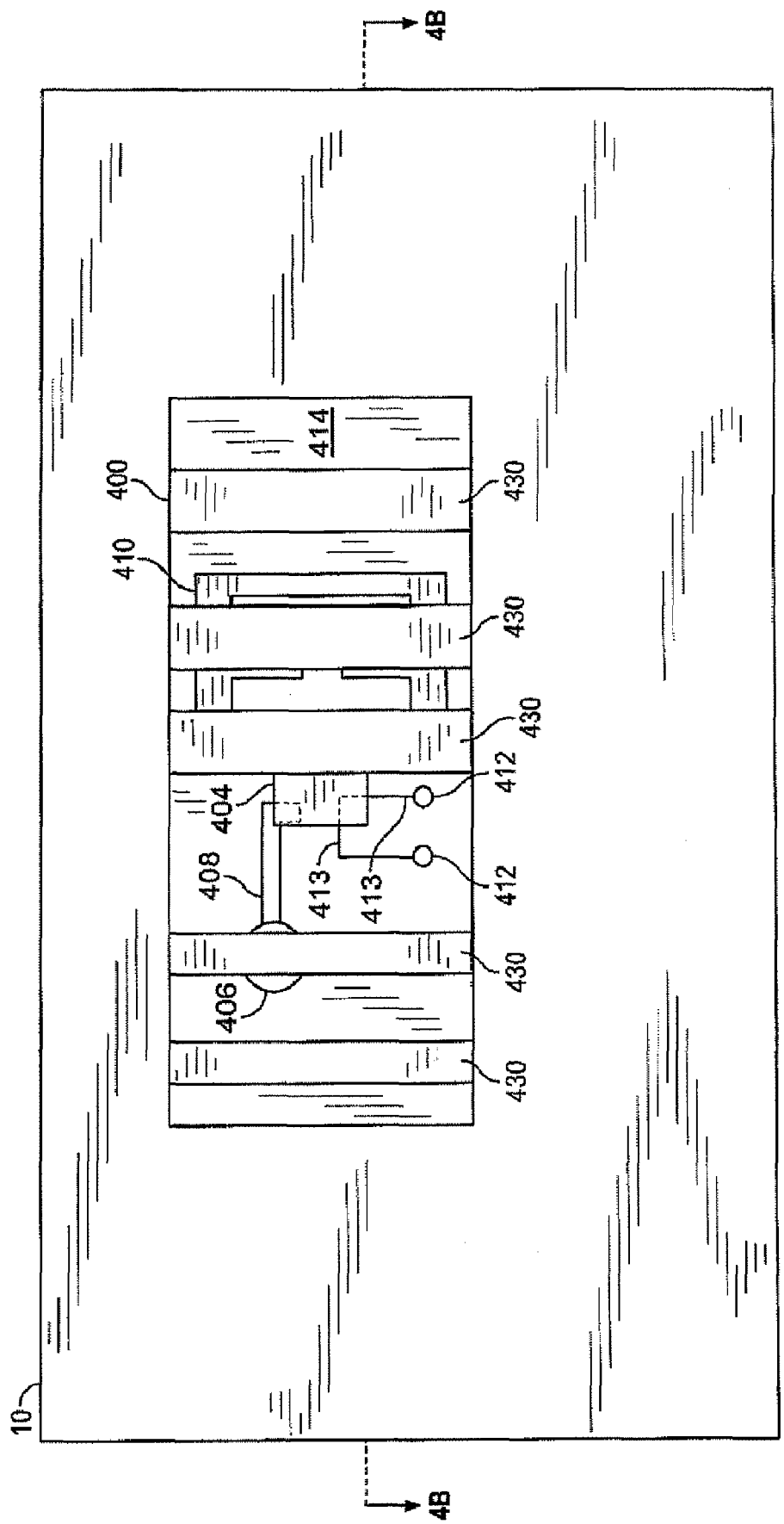

FIG. 4A shows a top view of an embodiment of label 400 that is in accordance with the principles of the present invention. Label 400 is substantially similar to label 300 of FIG. 3A. That is, it may include electronic circuitry 404, battery 406, conductors 408 and 413, antenna 410, contact points 412, and substrate 414. In addition, label 400 includes optical readable media. Optical layer 430 may be printed on receiver 10 and over circuitry, tangible elements, and printed elements already affixed to receiver 10. This is shown, for example, in FIG. 4B, which shows a cross-sectional view of label 400 taken along line A-A of FIG. 4A in accordance with the principles of the present invention.

Figure 5A:
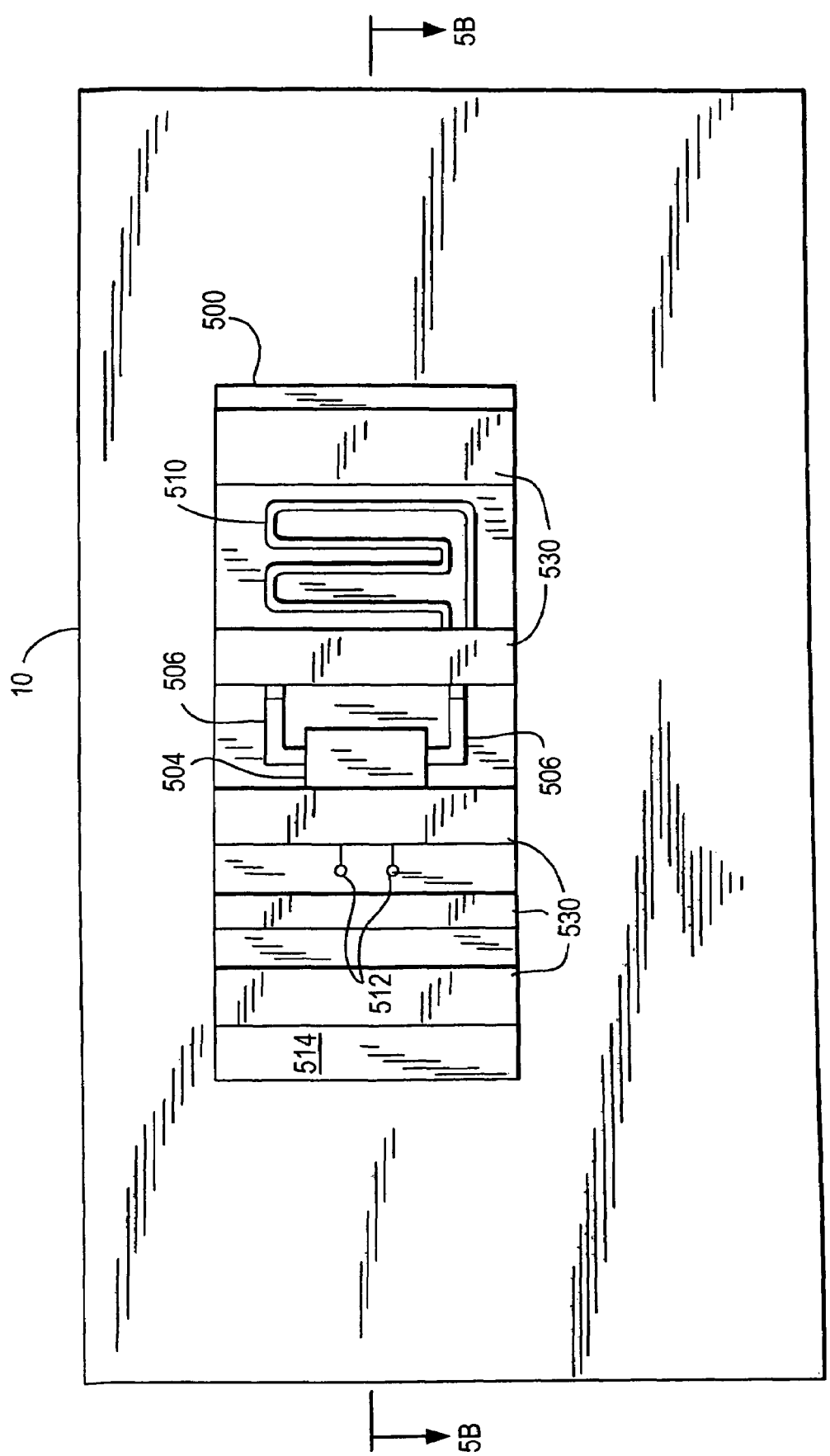
FIGS. 5A and 5B show different views of another detailed illustrations of a label that is in accordance with the principles of the present invention.
Figure 5B:
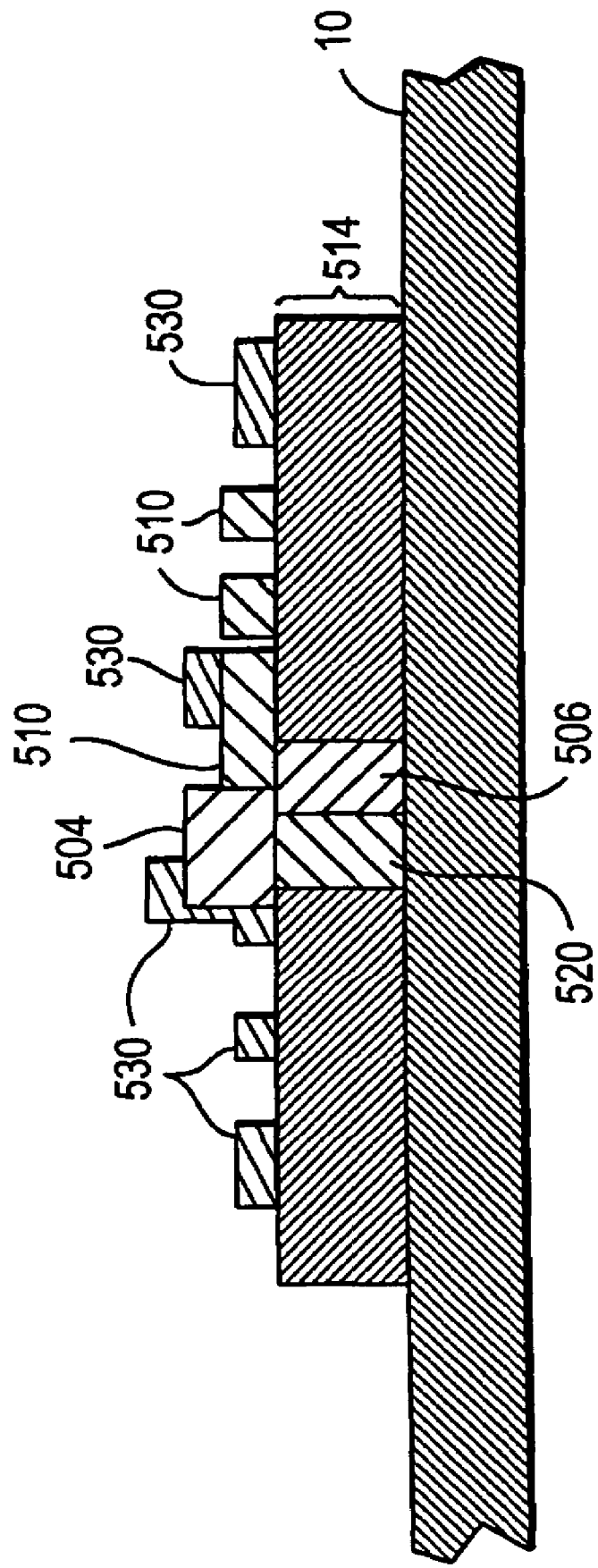

FIG. 5A shows a top view of an embodiment of label 500 and FIG. 5B shows a cross-sectional view of label 500 taken along line A-A of FIG. 5A in accordance with the principles of the present invention. The discussion of label 500 will be made with reference to both FIGS. 5A and 5B. Label 500 includes electronic circuitry 504, conductors 506, antenna 510, contact points 512, substrate 514 (which includes adhesive regions and conductive and non-conductive regions), and optical layer 530. In this embodiment, antenna 510 may be a tangible element and not a printed element as shown in FIGS. 3 and 4. Thus, antenna 510 may reside on top of substrate 514, as shown in FIG. 5B.

The cross-sectional view shows substrate 514 including conductor 506 (e.g., a conductive region) and adhesive regions 520. The other regions of substrate 514 not specifically referred to (e.g., regions other than regions 506 and adhesive region 520) may include non-conductive regions. Conductor 506 electrically couples antenna 510 to electronic circuitry 504 and adhesive regions 520 may affix antenna 510 to receiver 10. Optical layer 530 is shown to be disposed on top of any element upon which it resides.

It will be understood that the foregoing discussion of FIGS. 2-5 are merely illustrative of a few of many different labels that may constructed in accordance with the principles of the present invention. For example, indicia having varying spectral emissivity values may reside on the labels. Such indicia may be read or monitored by detecting transitions of differential emissivity on the surface of the label. See, for example, commonly-owned, co-pending U.S. patent application Ser. Nos. 10/824,975 and 10/973,926, filed Apr. 14, 2004 and Oct. 25, 2004, respectively, for more information regarding indicia having varying spectral emissivity values and methods and systems for detecting such indicia.

Referring now to FIGS. 6-16, embodiments of the present invention that enable labels according to the invention to be produced are now described. Generally, ribbons according to the principles of the present invention may include elements (e.g., tangible elements) and donor layers (e.g., printed elements) that are printed onto a receiver. Thus, when a ribbon is placed into, for example, printing machine 5 (of FIG. 1), the elements and donor layers retained thereon can be selectively printed on a receiver to provide a desired label.

Figure 6:
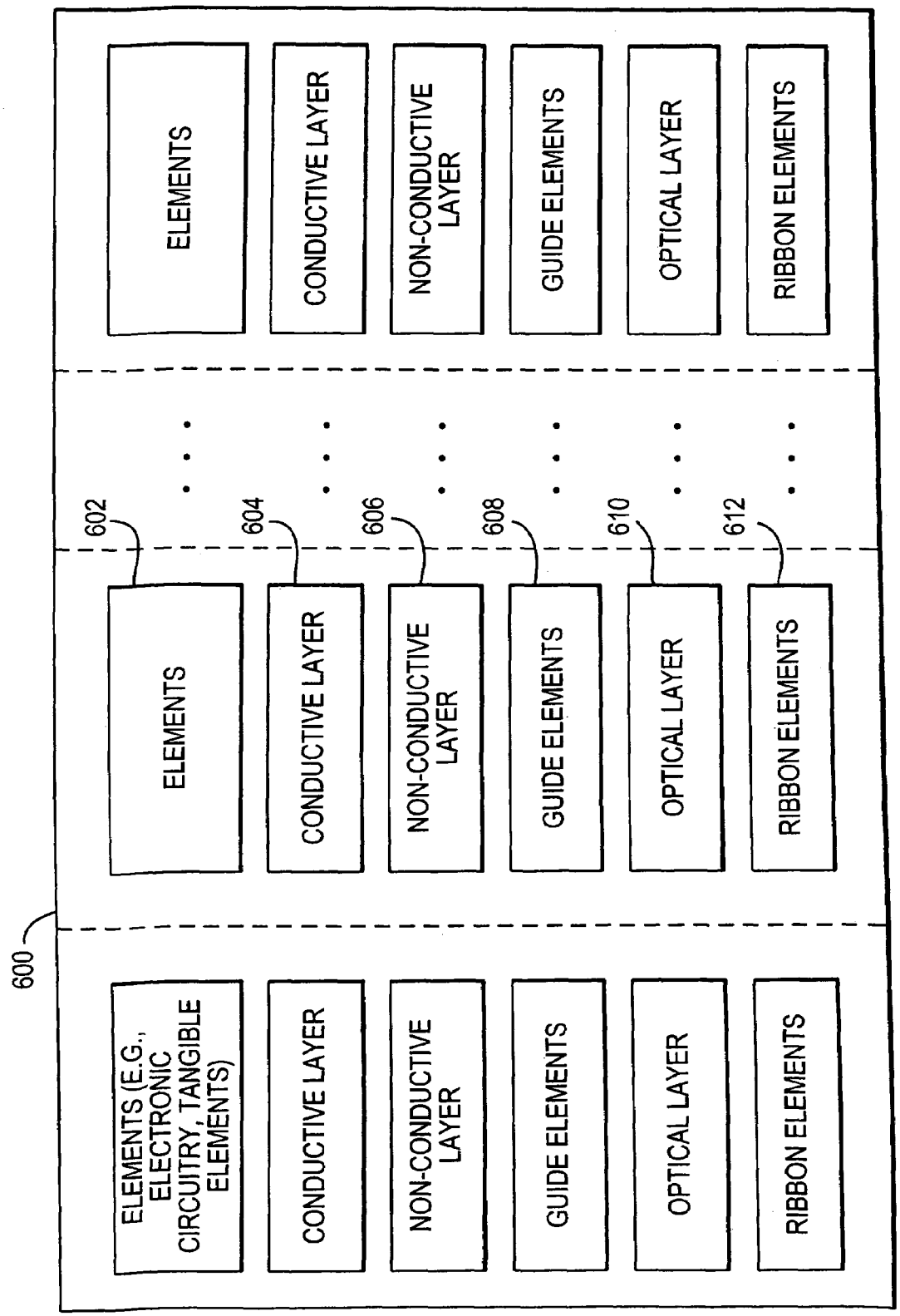
FIG. 6 shows an illustrative block diagram of a section of ribbon that is in accordance with the principles of the present invention.

FIG. 6 shows an illustrative block diagram of a section of ribbon 600 according to the principles of the present invention. More particularly, FIG. 6 shows several boxes, which represent different elements and layers, that may be arranged in predetermined locations on ribbon 600. The elements and layers may or may not overlap each other. The boxes are shown not to overlap to avoid cluttering FIG. 6, but it will be understood that one or more of such layers or elements may overlap.

Ribbon 600 may include, but is not limited to, a carrier (not shown), a retaining layer (not shown), elements 602 (e.g., electronic circuitry and tangible elements), conductive layer 604, non-conductive layer 606, guide elements 608, optical layer 610 (or a machine readable or human readable medium), and ribbon elements 612. Elements 602 may be elements from which elements 210 (FIG. 2) are derived and layers 604, 606, and 610 may be the layers from which donor layers 202 (of FIG. 2) are derived. The carrier provides structural support for ribbon 600, providing a platform for the layers and elements of the ribbon to reside. An appropriate carrier is selected that maintains the layers and elements in their desired locations during printing. The ability to maintain these desired locations may be necessary to ensure proper alignment of the layers and elements as they are printed onto the receiver. An example of a carrier is MYLAR™ film (bi-axially-oriented polyethylene terephthalate polyester film) having a predetermined thickness (e.g., 0.010″). Examples of such carriers are films of Vitel Polyester PE222 by Goodyear Tire and Rubber Company of Akron, Ohio, or MYLAR™ 49000 polyester film by Dupont Corporation of Wilmington, Del.

The carrier may include guide elements 608 that assure proper identification or registration of the layers and elements during printing. Guide elements 608 may include holes or punches, magnetic or electrically conductive materials, or marks that identify or register particular regions or fields, layers, and elements of ribbon 600. Guide elements 608 may be "built into" the carrier itself without requiring anything to hold elements 608 in place. For example, if guide elements 608 are holes, such holes may be punched directly out of the carrier. Magnetic or electrically conductive materials may form part (e.g., the outer perimeter) of the carrier and may be programmed to indicate which sections of the ribbon contains particular fields or regions, layers, or elements. Such programming may be akin to writing data on a magnetic tape.

Guide elements 608 may be monitored, and based on the monitoring, ribbon 600 may be fed (forward or backward or both) to ensure that the layers and elements are accurately printed. If desired, guide elements 608 may be used to identify regions or fields of ribbon 600. As will be described in more detail below, a particular region may include a particular layer (e.g., a conductive layer or an optical layer). For example, if a printed element such as a conductor requires printing, ribbon 600 may be fed such that a conductive region 604 is in an appropriate position so that the conductor can be printed onto a receiver.

The retaining layer (not shown) retains elements 602 (which may include the same elements 210 described above in connection with FIG. 2) on ribbon 600 until they are affixed to a receiver during printing. The retaining layer may be, for example, a thermal ink composition or other suitable material. An example of a retaining layer is Monarch 9446 Thermal Transfer manufactured by Monarch Marking Systems of Dayton, Ohio. A thermal material may prevent elements 602 from being removed from the ribbon until the temperature of the material rises above a predetermined temperature. When at temperature, the material "loosens" its grip on element 602, thereby allowing transfer from the ribbon to the receiver.

Alternatively, the retaining layer may be an adhesive material that retains element 602 until pressure is applied to cause element 602 to be transferred from the ribbon to the receiver. The adhesive material may be a wax such as PED waxes by Hoechst AG of Frankfurt, Germany.

Elements 602 may include any element having a predefined or tangible existence (e.g., physical structure and/or functional existence) prior to being included on ribbon 600. For example, elements 602 may include circuitry, batteries, antennas, conductors, holograms, tokens, and other physical elements. An adhesive may reside on elements 602 such that when the element is printed, the adhesive affixes the element to, for example, the receiver.

Conductive layer 604 includes a material that is electrically conductive and has the ability to conduct, for example, electrical signals when printed. Conductive layer 604 may be used for printing printed elements (e.g., printed elements 222 discussed above in connection with FIG. 2). For example, conductors that interconnect elements 602 (on the label) may be derived from conductive layer 604. In another example, an antenna may be derived from conductive layer 604.

Conductive layer 604 may be a conductive ink. An example of a conductive ink includes a suspension of an electrically conductive material (e.g., copper) in a carnauba wax. See, for example, U.S. Patent Application No. US2004/0175515 for an more detailed explanation of a conductive ink composition, the disclosure of which is hereby incorporated herein by reference in its entirety.

Non-conductive layer 606 includes a material that is not electrically conductive. Non-conductive layer 606 may be printed in strategic locations to prevent, for example, short-circuiting of elements (e.g., conductive elements and circuitry) on the label. Non-conductive layer 606 may include a non-conductive ink composition such as carnauba wax.

Optical layer 610 includes a material for printing conventional or invisible indicia or marks. For example, optical layer 610 may provide a basis for printing labels. Optical layer 610 may include a conventional ink, such as a carnauba ink, for printing conventional indicia, invisible ink, such as transparent inks that include UV fluorescent materials (e.g., zinc cadmium sulfide or gadolinium oxi-sulfide), for printing invisible indicia, or a combination thereof.

Conductive layer 604, non-conductive layer 606, and optical layer 610 may each reside on the ribbon as a region or a field. That is, the respective layers may each occupy a predetermined section of the ribbon. By arranging layers 604, 606, and 610 in regions, the ribbon can be positioned so that a particular region is properly aligned within the printing machine, thereby enabling the printing machine to print the contents of that region.

Ribbon elements 612 include elements known to those skilled in the art to facilitate printing and transfer of layers 604, 606, and 610 to a substrate (e.g., the receiver). For example, lubricants (e.g., silicone oil), plasticizers (e.g., di-octyl thalate), and release agents (e.g., talc) may be incorporated into layers 604, 606, and 610 as ribbon elements 612.

It is understood that while FIG. 6 shows conductive layer 604, non-conductive layer 606, and optical layer 610 as separate layers, the present invention is not limited as such. In fact, two or more such layers may be combined into the same layer—yielding a multi-purpose layer. Multi-purpose layers may each include materials that can perform the functions of two or more different layers (e.g., a conductive layer and an optical layer). This advantageously provides an economy for use on ribbon 600 (e.g., less space may be required for a multi-purpose layer in contrast to space required for two independent layers).

An example of multi-purpose layer may include a conductive material and an optical material. Thus, when this layer is printed, both conductive and optical materials may be simultaneously transferred to, for example, a receiver. It will be understood that such a multi-purpose layer can be strategically printed solely for its optical properties. That is, the layer may be printed in a location or locations to provide a predetermined mark. In some instances, if such a mark is printed, the conductive properties of the multipurpose layer may "unintentionally" electrically couple, for example, tangible elements 602 (e.g., a battery to an antenna). This unintentional coupling may be avoided by printing a layer, which includes a non-conductive optical material, in place of the portion of the mark where the electrical coupling is undesired, thereby enabling the desired mark to be printed while at the same time preventing the undesired electrical coupling.

An advantage of the ribbon according to the present invention is that it provides substantial flexibility in the design, layout, and composition of the elements and layers provided thereon. Thus, ribbon 600, for example, may be constructed to fulfill any predetermined criteria. For example, ribbon 600 may be constructed to promote the ease in which a printing machine may print selected elements and layers onto, for example, a receiver to provide a predetermined label. In fact, as will be described in more detail in connection with the text accompanying FIGS. 7-11, there is a relationship between the layout of the ribbon and its interaction with a printing machine.

It is understood that FIG. 6 is merely illustrative and that additional elements or layers may be added to ribbon 600, and that elements or layers may be omitted. For example, in FIG. 6, optical layer 610 may be omitted.

FIG. 7A shows a top view of an embodiment of ribbon 700 in accordance with the principles of the present invention. More particularly, FIG. 7A shows a section of ribbon 700 that includes elements and layers for printing three separate labels. For brevity and clarity, and to avoid overcrowding FIG. 7A and FIG. 7B (discussed below), the elements and layers of only one sub-section (i.e., the center sub-section) of ribbon 700 are labeled. As shown in FIG. 7A, ribbon 700 includes guide elements 704, RFID circuitry 710, conductive layer 712, non-conductive layer 714, and optical layer 716. RFID circuitry 710, may reside in region 720 of ribbon 700, layer 712 in region 722, and layers 714 and in region 724.

FIG. 7B shows a cross-sectional view of ribbon 700 taken along the line A-A of FIG. 7A in accordance with the principles of the present invention. The cross-sectional view shows that ribbon 700 includes carrier 702 and adhesive layer 711, in addition to RFID circuitry 710, layer 712, and layer 714. As shown, adhesive layer 711 may reside on top of RFID circuitry 710.

Figure 8:
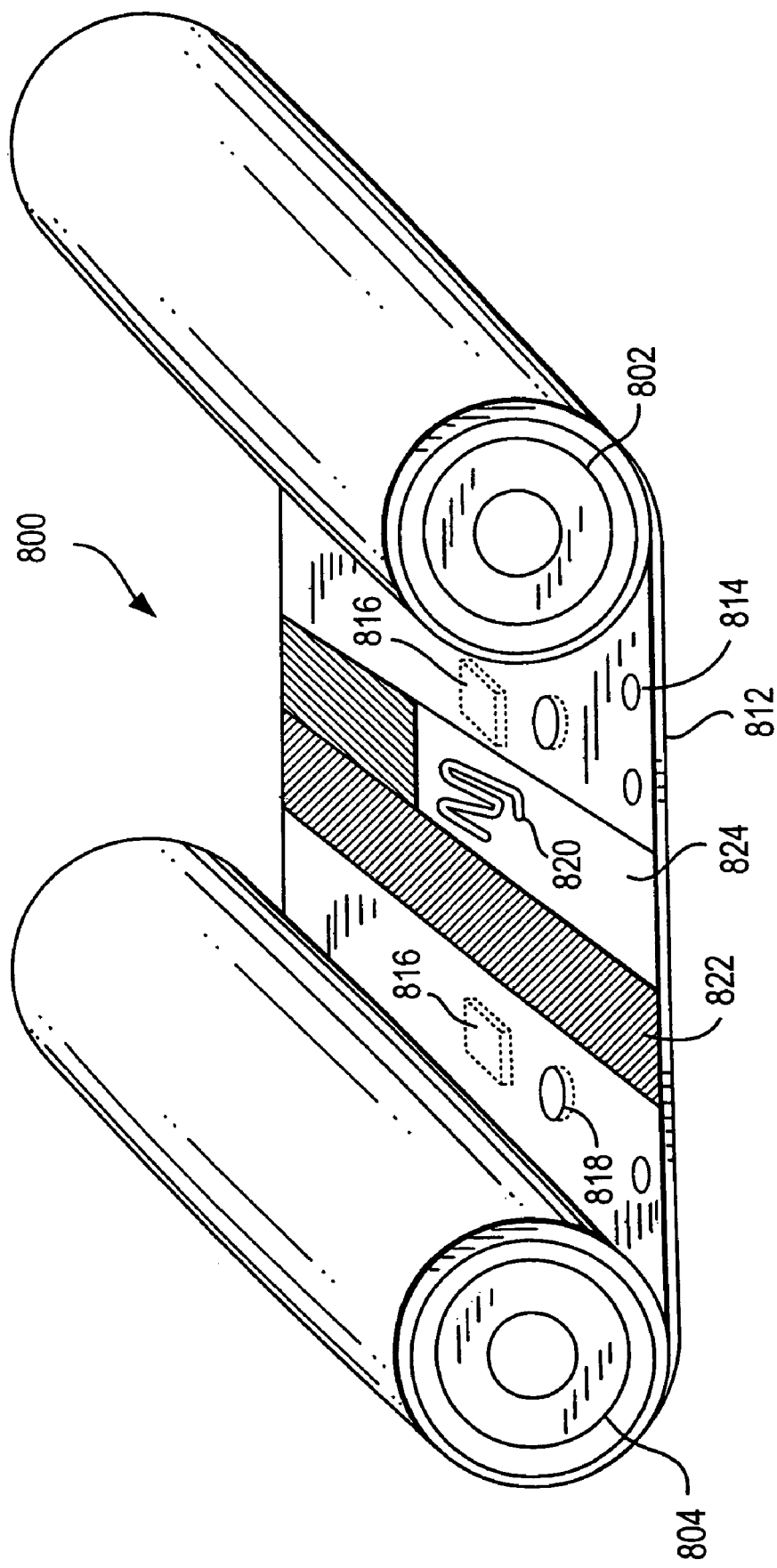
FIG. 8 shows an illustration of a ribbon assembly that is in accordance with the principles of the present invention.

FIG. 8 shows a perspective view of an embodiment of a ribbon assembly 800 that is in accordance with the principles of the present invention. Ribbon assembly 800 may serve as a "cartridge" that can be inserted into a printing machine for printing indicia according to the present invention. As shown, assembly 800 includes feeder roll 802, for supplying a ribbon including predetermined elements and layers, and take-up roll 804, for retrieving the ribbon after printing.

As shown in FIG. 8, the ribbon includes carrier 812, guide elements 814, RFID circuitry 816, battery 818, antenna 820, and regions 822 and 824. In this embodiment, guide elements 814 are shown as punched holes and circuitry 816, battery 818, and antenna 820 are shown as physical elements (e.g., tangible elements) that can be transferred from the ribbon to a substrate (e.g., receiver). Region 822 may include one or more predetermined thermal transfer materials. For example, region 822 may include a conductive ink, an optical ink, or a mixture of both optical and conductive ink. Region 824 illustrates that a region may include elements, such as antenna 820, and a layer of thermal transfer material. Though not shown in FIG. 8, another region may include circuitry 816 and battery 818.

If ribbon assembly 800 or ribbon 700 (of FIG. 7) is used for generating labels according to the present invention, the elements and layers may be placed face down so that application of a printing means (e.g., a heat transfer element) results in a substantially direct transfer of the element or layer from the ribbon to, for example, a receiver. For reference, in FIGS. 7 and 8, the elements and layers are shown face up.

Figure 9:
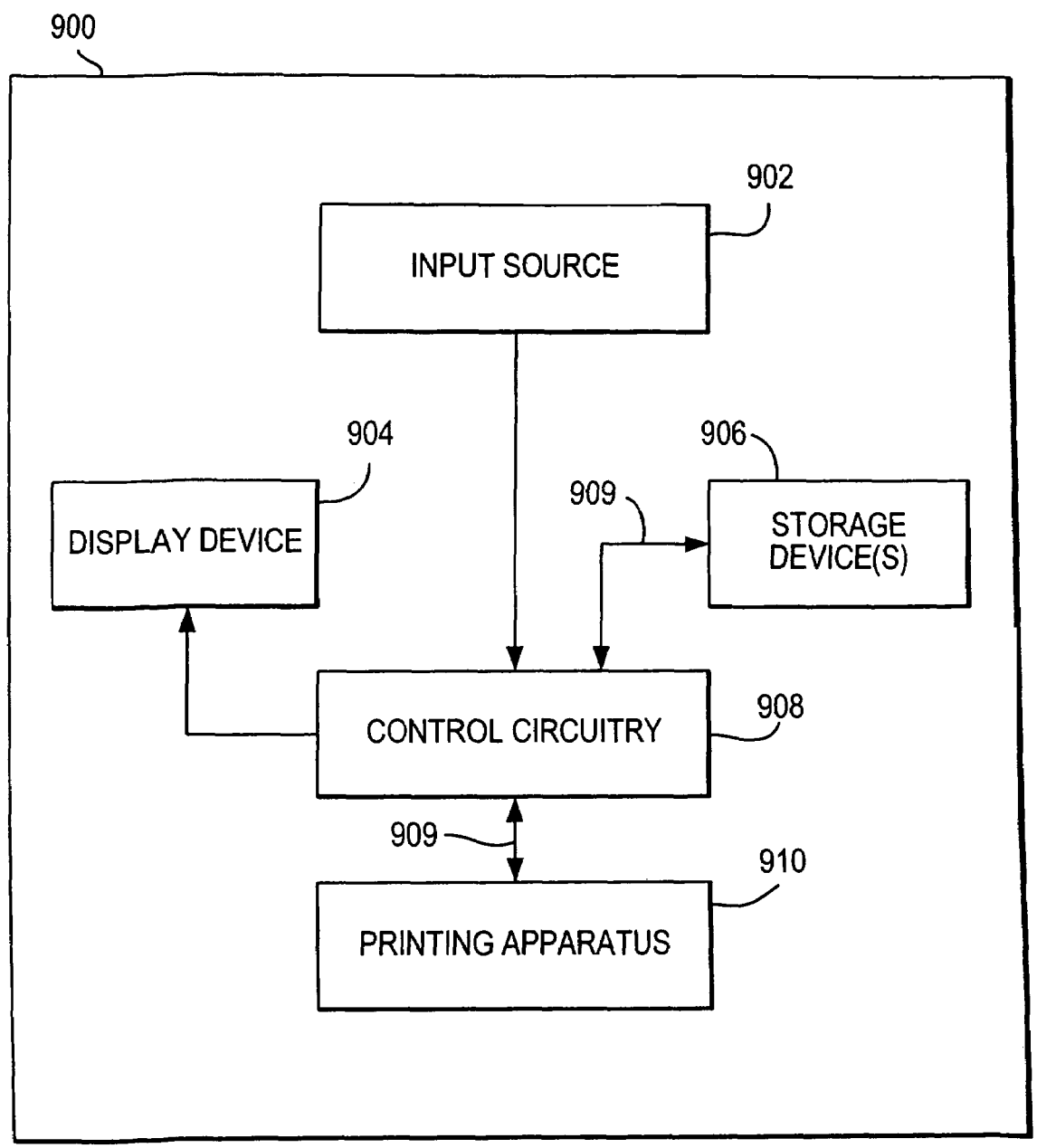
FIG. 9 shows a block diagram of a printing system that is in accordance with the principles of the present invention.

FIG. 9 shows a block diagram of a printing system 900, such as printing system 5 (of FIG. 1), that is in accordance with the principles of the present invention. Printing system 900 may include an input source 902, display device 904, storage device 906, control circuitry 908, and printing machine 910. Control circuitry 908 may include a processor and other circuitry (e.g., circuitry for controlling specific functions of printing machine 910) based on data received from input source 902, storage device 906 (e.g., memory or a database), and printing machine 910 (e.g., sensors). In addition, control circuitry 908 is operable to control the flow of data between control circuitry 908 and printing machine 910, and control circuitry 908 and storage device 906, as evidenced by bi-directional communications path 909. Further, control circuitry 908 may provide data to display device so that information pertaining to, for example, the operation of system 900 can be displayed.

Input source 902 may include any source from which data can be provided to control the operation of control circuitry 908 to generate predetermined labels. For example, source 902 may include a local input source (e.g., a keypad, keyboard, or computer attached to system 900) that enables a user or computer (operating according to programmed protocols) to specify desired parameters for labels being produced by system 900. Local source 902 may reside within or on the body of the system 900. As another example, source 902 may include a remote source (e.g., a control center that is interfaced with system 900 via a network) that enables a user or computer to remotely specify desired parameters for labels being produced by system 900. The remote source may transmit data to control circuitry 908 via a hard-wired connection (e.g., a cable), a wireless connection (e.g., infrared, Bluetooth™, broadband wireless connection, etc.) or other remote source technology. It is understood that while the foregoing mentions a couple examples of input sources, the present invention may be practiced using any conventional device (e.g., keyboard or mouse) or system (e.g., computer or control center) may be used, therefore a detailed discussion of such input sources is not necessary.

Storage device 906 may include one or more devices capable of storing data. For example, storage device may include volatile memory (e.g., RAM, SDRAM, flash memory, etc.), non-volatile memory (e.g., ROM), digital storage devices (e.g., a hard-drive, a tape backup drive, or an optical drive for reading data from and writing data to disks). Storage device 906 may be controlled by control circuitry 908. For example, control circuitry 908 may cause data to be stored on storage device 906 and may retrieve data from storage device 906. Data stored in storage device 906 may include programs that are implemented by control circuitry 908 to instruct printing machine 910 to print labels and performing other operations (e.g., testing and programming the labels or indicia residing thereon) in connection with printing machine 910.

Control circuitry 908 generally operates to coordinate the interaction and operation of the components of system 900. For example, control circuitry 908 may be responsive to inputs received from input source 902 and storage device 906 to control the operation of printing machine 910. Control circuitry 908 may run software that is loaded onto, for example, storage device 906, transmit signals to various components of printing machine 910, and utilize any technology available for operating system 900 in accordance with the principles of the present invention.

In addition, control circuitry 908 may provide signals to display device 904 for displaying information. For example, information indicating the number of labels that have been printed (e.g., batch count), the available quantities of material (e.g., ribbon) available for printing labels, the characteristics of the labels being printed, operational status (e.g., fault error), or any other information. If desired, information may be displayed in response to commands received from input source 902, storage device 906, or a combination thereof.

Printing machine 910 may be any machine capable of printing labels in accordance with the principles of the present invention. Thus, printing machine 910, operating under the direction of control circuitry 908, may print labels on demand. That is, printing machine 910 may print a first label according to a first predetermined set of parameters and subsequently print a second label according to a second set of parameters without requiring any retooling or reconfiguring of the machine. Advantageously, rather than retooling or reconfiguring the machine, control circuitry 908 can provide the appropriate signals (in response to received inputs from input source 902 or storage device 906) to cause printing machine 910 to print a predetermined label.

In addition to printing predetermined labels, printing machine 910 may also be able to program and test the label, or indicia thereof. For example, printing machine 910 may program electronic circuitry (e.g., RFID circuitry) before, after, or while it is being printed onto a receiver. This programming ability further adds to the on demand label production capabilities of printing system 900. Moreover, the testing capabilities enables printing system 900 to verify whether a particular label operates properly, thereby providing a means for preventing defective labels from being used. The programming and testing may be performed under the direction of control circuitry 908.

Figure 10:
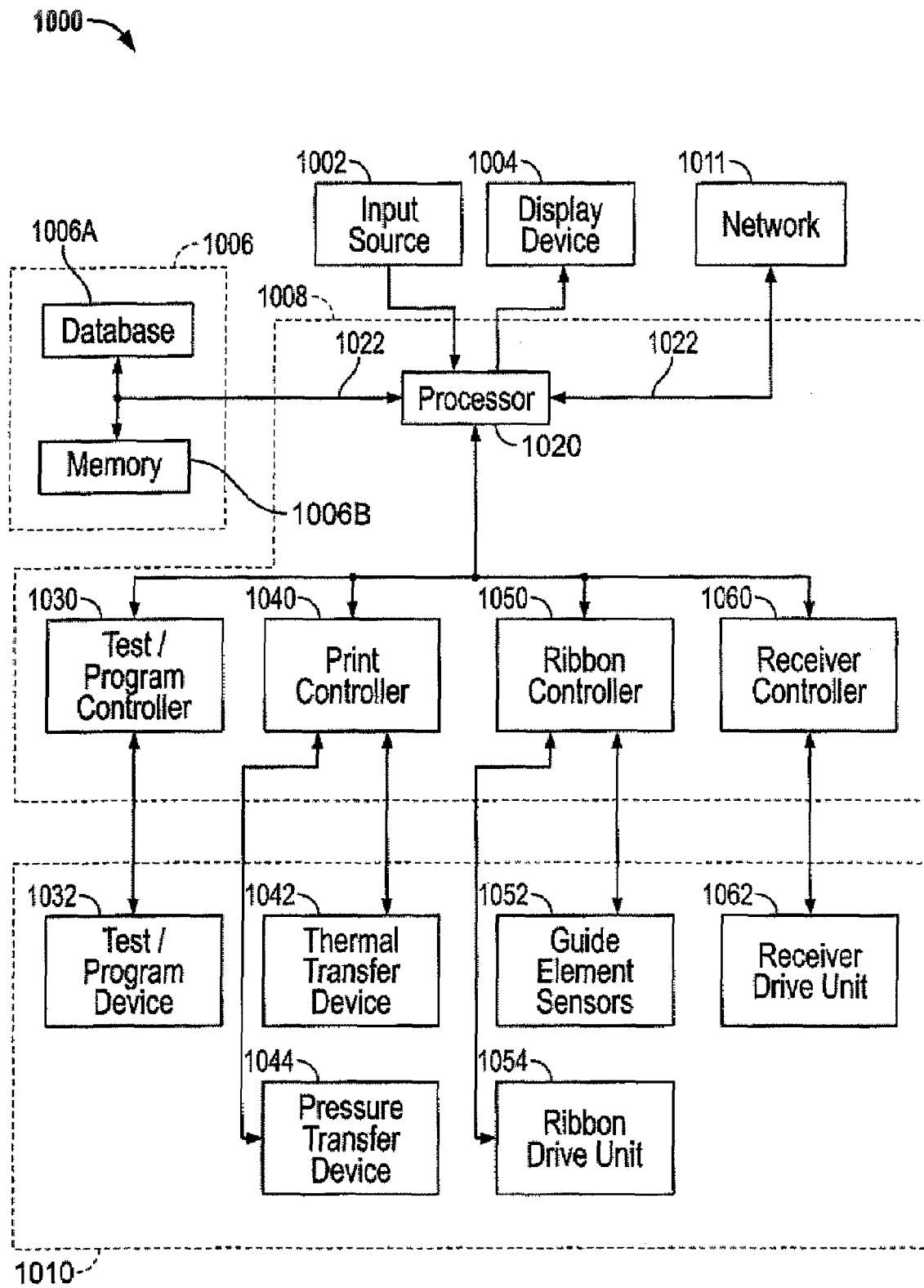
FIG. 10 shows a more detailed block diagram of the printing system shown in FIG. 9 in accordance with the principles of the present invention.

FIG. 10 shows another block diagram of a printing system 1000 that is in accordance with the principles of the present invention. Printing system 1000 includes components discussed above in connection with printing system 900, but printing system 1000 illustrates a more detailed embodiment of system 900. For example, printing system 1000 includes input source 1002, display device 1004, storage devices 1006, control circuitry 1008, printing machine 1010, and network 1011. Note that components 10XX in FIG. 10 are similar to and may perform the same functions as components 9XX of FIG. 9. Persons skilled in the art will appreciate that, in various embodiments of the present invention, similar or identical components may be utilized to perform similar or identical functions. Therefore, the foregoing discussion with respect to components 9XX also applies to components 10XX.

A difference between FIG. 9 and FIG. 10 is that FIG. 10 illustrates examples of components or subsystems that may be included in storage devices 1006, control circuitry 1008, and printing machine 1010. As shown in FIG. 10, storage device 1006 includes database 1006A and memory 1006B, control circuitry 1008 includes a processor 1020, test/program controller 1030, print controller 1040, ribbon controller 1050, and receiver controller 1060, and printing machine 1010 includes test/program device 1032, thermal transfer device 1042, pressure transfer device 1044, guide element sensors 1052, ribbon drive unit 1054, and receiver drive unit 1062.

Storage device 1006, control circuitry 1008, are shown to be contained in dashed-line boxes to indicate that the arrangement of the components and subsystems contained therein are merely illustrative. For example, as an alternative arrangement, memory 1006B may be included within control circuitry 1008, instead of being included as part of storage device 1006. As a further alternative embodiment, test/program controller 1030, print controller 1040, ribbon controller 1050, receiver controller 1060, or a combination thereof may be included as part of printing machine 1010, rather than part of control circuitry 1008.

Processor 1020 may be any conventional processor capable of performing data processing functions of control circuitry 1008. Processor 1020 may receive data from and transmit data to storage device 1006, network 1011, test/program controller 1030, print controller 1040, ribbon controller 1050, and receiver controller 1060. Bi-directional communication lines 1022 may be provided to enable such bi-directional transfer of data. In addition, processor 1020 may transmit data to display device 1004 and receive data from input source 1002.

During operation of printing system 1000, processor communicates with controllers 1030, 1040, 1050, and 1060 to generate labels on demand. Controllers 1030, 1040, 1050, and 1060 may each include circuitry to perform specific control functions. For example, test/program controller 1030 may be operative to control test/program device 1032. Similarly, print controller 1040 may be operative to control thermal transfer device 1042 and pressure transfer device 1044; ribbon controller may be operative to control guide element sensors 1052 and ribbon drive unit 1054; and receiver controller 1060 may be operative to control receiver drive unit 1062. Thus, it is understood that the operation of the components in printing machine 1010 (e.g., thermal transfer device 1042) are controlled by processor 1020 by via the appropriate controller (e.g., print controller 1040), and, that by virtue of this control, data provided to processor (from input source 1002, storage device 1006, and network 1011) can instruct processor to generate a predetermined label on demand.

Figure 11:
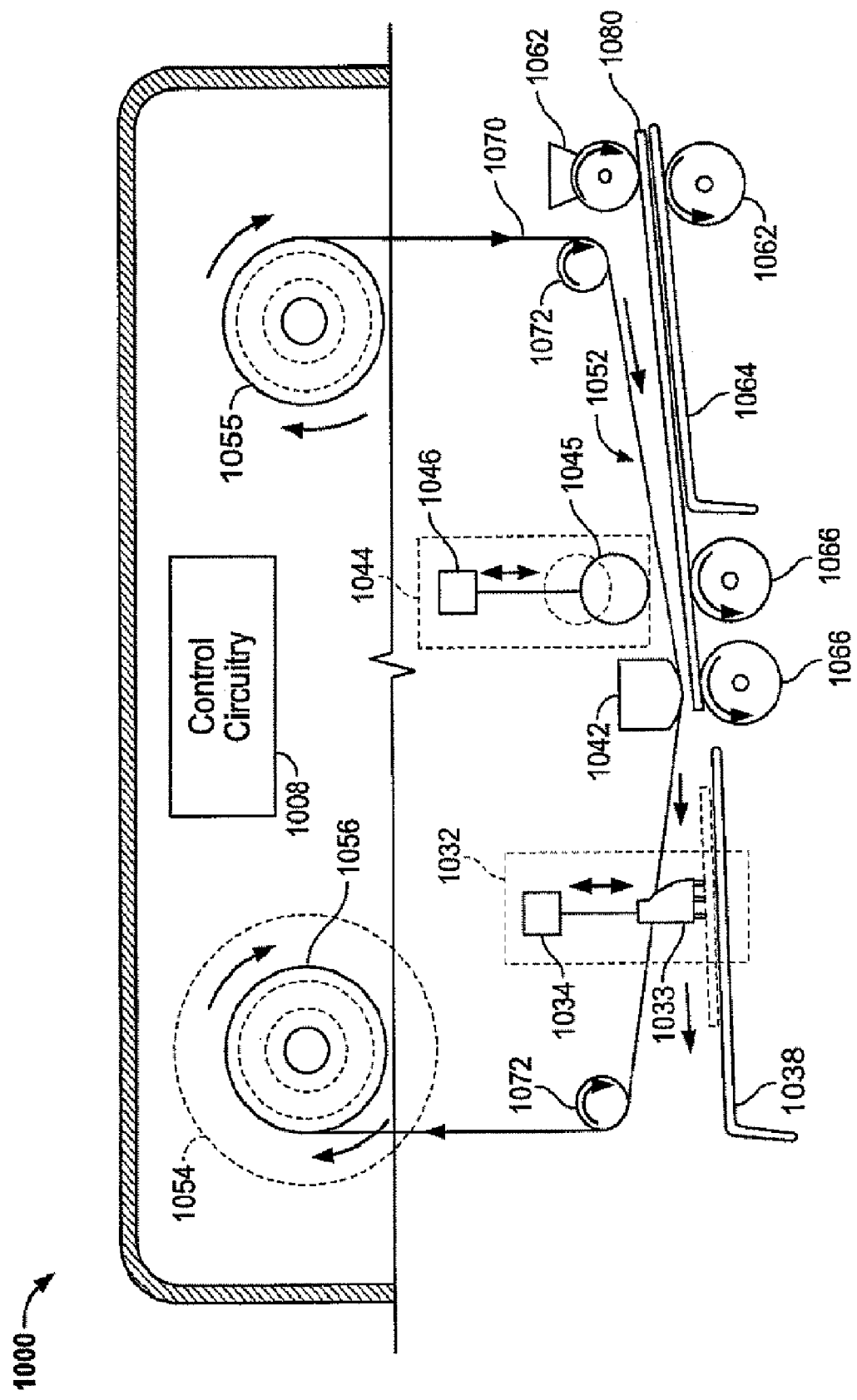
FIG. 11 shows a diagrammatic illustration of a printing system that is in accordance with the principles of the present invention.

Referring now to both FIGS. 10 and 11, a method of using printing system 10 is described to illustrate how labels may be generated according to the invention. FIG. 11 shows a diagrammatic view of sections of printing system 1000 and other components not shown in FIG. 10 in accordance with the principles of the present invention. Ribbon 1070 (e.g., ribbon 600 of FIG. 6) is supplied by a ribbon supply roll 1055 and taken up by take-up roll 1056. The combination of ribbon 1070, supply roll 1055, and take-up roll 1056 may constitute an assembly similar to ribbon assembly 800 discussed above in connection with FIG. 8. Tension elements 1072 may assist supply roll 1055 and take-up roll 1056 in holding ribbon 1070 taut as it passes from supply roll 1055 to take-up roll 1056. Other elements (not shown) may be provided to prevent torsion or twisting of ribbon 1070. A taut ribbon 1070 may promote printing accuracy of elements (e.g., circuitry, antennas, batteries, etc.) and layers (e.g., conductive ink, optical ink, etc.) onto receiver 1080.

Ribbon drive unit 1054 which may include one or more conventional motors (e.g., DC motor, AC motor, induction motor, etc.), may control the rate and directions in which ribbon 1070 is transported through printing machine 1010. As shown in FIG. 11, drive unit 1054 is coupled to take-up roll 1056 and operates the rotate roll 1056 at a predetermined speed or range of speeds to draw ribbons from supply roll 1055. Because drive unit is shown being coupled to first take-up roll 1056, the ribbon may travel in one direction (e.g., right-to-left). As an alternative, drive unit 1054 may, also be coupled to supply roll 1056, thereby enabling ribbon 1070 to move in both directions (e.g., left-to-right and right-to-left). Regardless of which embodiment is implemented, ribbon driver unit 1054 may operate in connection with guide element sensors 1052. That is, guide element sensors 1052 may transmit data indicative of the position of ribbons 1070 to control circuits 1008, (more particularly, ribbon controls 1050), which may then transmit the appropriate signals to control the operation of drive unit 1054. To position ribbon 1070 in a predetermined position with respect to thermal transfers device 1042 or pressure transfer device 1044. When ribbon 1070 is positioned in a predetermined position, signals may be transmitted from control circuitry 1008 to thermal transfer device 1042 or pressure transfer device 1044 to cause selected portions of ribbon 1070 to be transferred to receiver 1080.

Guide element sensors 1052 may be any device capable of detecting guide elements such as guide elements 704 of FIGS. 7 and 814 of FIG. 8. It is understood that sensors 1052 may be selected to detect the specific guide elements contained on ribbons 1070. For example, if the guide elements are magnetic devices, sensors 1052 preferably are able to detect magnetic signals. As another example, if guide elements are holes, sensors 1052 may be optical sensors for detecting the presence of such holes.

Thermal transfer device 1042 may be any device responsive to commands provided by control circuitry 1008 or, more particularly, print controller 1040, to thermally transfer selective portions of ribbon 1070 to receiver 1080. Thermal transfer device 1042 preferably thermal transfers, for example, layers residing on ribbon 1070 (e.g., a conductive link layer) to receiver 1080 without chemically altering the layer (like the way conventional ink jet technology chemically alters ink). This is accomplished by thermally transferring the layer to receiver 1080. That is, a plurality of elements (not shown) in device 1042 may be selectively heated to effect transfer of a predetermined pattern of a donor layer to receiver 1080. The heating elements may include, for example, resistors, transistors such as thin-film transistors, or other heat-bearing elements. Thermal transfer device 1042 may be sufficiently sized such that it can transfer any portion of the donor layer. For example, considering ribbon 700 of FIG. 7 as an example, device 1042 may be constructed such that it can transfer any portion across the entire width of layer 712 to receive 1080, This approach enables transfer device 1042 to quickly and accurately transfer donor layer without requiring device 1042 to be positioned in an appropriate position to effect desired heat transfer.

In an alternative approach, thermal transfer device 1042 may be moved horizontally with respect to ribbon 1070 in order to position it properly to effect desired heat transfer. For example, referring again to ribbon 700 of FIG. 7, when region 724 is positioned under device 1042, device 1042 may be moved horizontally across width of ribbon 700 such that in a first position, it may be positioned over layer 714, and in a second position, it may be positioned over layer 716.

As a further alternative embodiment, two or more thermal transfer devices may be used to effect thermal transfer in accordance with the invention. For example, multiple thermal transfer devices may be arrayed in parallel or may be arranged in a staggered parallel fashion.

Pressure transfer device 1044 may be any device responsive to commands provided by control circuitry 1008 or, more particularly, print controller 1040 to transfer through applications of a predetermined pressure selective portions of ribbon 1070 to receiver 1080. Pressure transfer device 1044 may transfer elements (e.g., circuitry, batteries, antennas, etc.) by selectively lowering roller 1045 onto ribbon 1070. Roller 1045 preferably contacts ribbon with sufficient (e.g., whether it is an element or an adhesive layer) force to cause whichever portion of ribbon 1070 it contacts to be transferred to receiver 1080. Roller control device 1046, which may be a solenoid, may lower and raise roller 1045 as needed to effect pressure transfer. In particular, roller 1045 may contact the carrier (e.g., carrier 702 of ribbon 700) portion of ribbon 1070.

If desired, two or more rollers may be used to selectively apply pressure to ribbon 1070. For example, the plurality of rollers may be arrayed in parallel or staggered according to predetermined design criteria.

Although FIG. 11 shows thermal transfer device 1042 and pressure transfer device 1044 as two independent units, those of skill in the art will appreciate that the functionality of both devices may be combined into a single device in the case where contact pressure of and heat from the thermal transfer device is sufficient to release components from the carrier and bond them on the substrate. Receiver 1080 is selectively fed through printing machine 1010 by receiver drive unit 1062, which is responsive to signals provided by control circuitry 1008. Receiver drive unit 1062 feeds receiver 1080 over support 1064 and support rollers 1066 to support 1038. Control circuitry 1008 may coordinate the advance of receiver 1080 in connection with the advance of ribbon 1070 to ensure concomitant printing.

As ribbon 1070 is initially fed from supply roll 1055, the carrier end of the ribbon is faced towards guide element sensors 1052, pressure transfer device 1044 and thermal transfer device 1042, and the donor layers and elements are faced towards receiver 1080. Under the control of signals provided by control circuitry 1008, transfer devices 1042 and 1044 may transfer donor layers and elements to receiver 1080. The printed portion of ribbon 1070 is then taken up by take-up roll 1056.

Test/program device 1032 is responsive to control signals to test and/or program labels being generated in printing machine 1010. For example, test/program device 1032 may cause an RFID device to transmit its predetermined data, whether printed conductors have properly electrically coupled various elements, or whether the printed mark conforms with predetermined specifications. To perform testing and/or programming, probe 1033 may be lowered and raised as necessary by mechanism 1034 to make contact with test probe points on the label residing on support 1038.

Although FIG. 11 shows test/program device 1032 positioned to test and program labels or indicia thereof after it has been generated, it is understood that testing and programming may be performed in any stage (e.g., before, during, or after printing) of the printing process. For example, elements such as electronic circuitry (e.g., RFID circuitry) may be programmed on ribbon 1070 prior to being transferred to receiver 1080. After such element has been transferred to receiver 1080, it may be tested.

FIGS. 12-15 shows several flowcharts illustrating various processes that may be performed using system 1000. Accordingly, reference to various components of system 1000 may be made in connection with the discussion corresponding to FIGS. 12-15.

Figure 12:
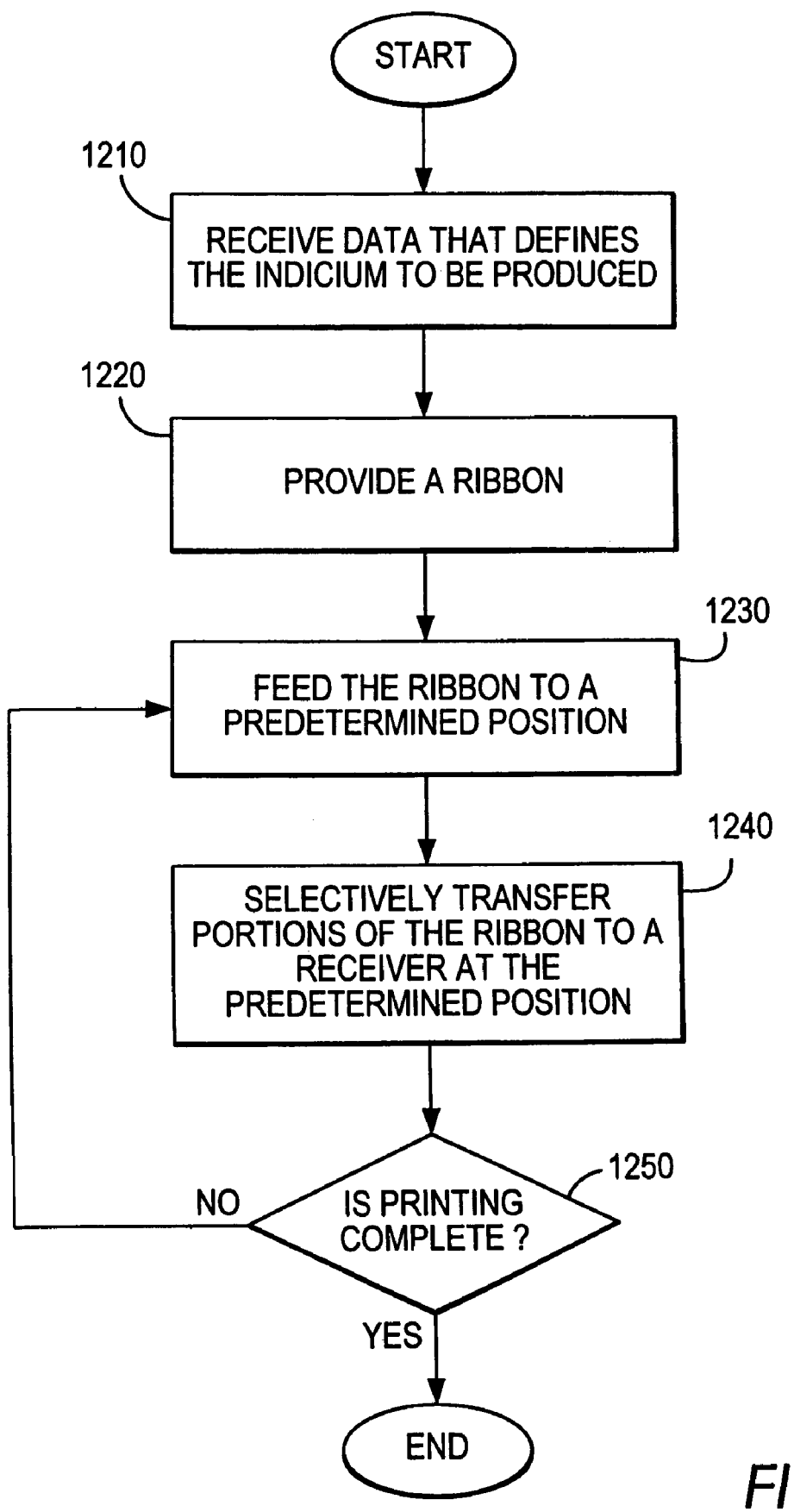
FIG. 12 shows a flowchart for printing indicia in accordance with the principles of the present invention.
Figure 13:
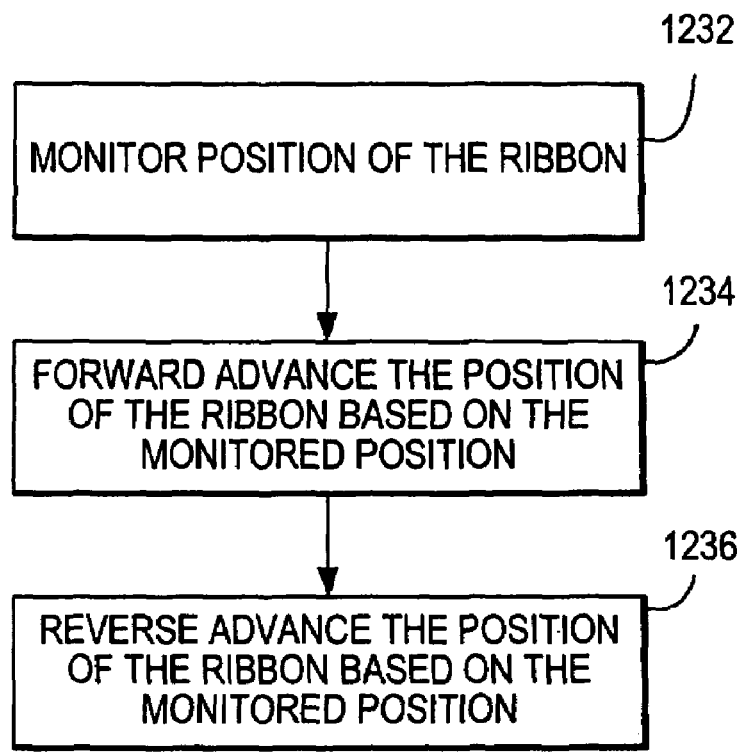
FIG. 13 is a flowchart illustrating with more detail a ribbon feeding step shown in FIG. 12 in accordance with the principles of the present invention.

FIG. 12 shows a flowchart illustrating a process for printing labels in accordance with the principles of the present invention. Starting at step 1210, printing system 1000 may receive data that defines the label to be produced. Control circuitry 1008 may use this data to generate and provide the appropriate control signals to various components of printing system 1000 to produce the desired label. At step 1220, a ribbon is provided. The ribbon is fed to a predetermined position, as indicated at step 1230. For example, the ribbon may be fed in response to control signals provided by control circuitry 1008. Referring now to FIG. 13, FIG. 13 illustrates steps that may be performed to feed the ribbon to a predetermined position. At step 1232, the position of the ribbon may be monitored. Such monitoring may be performed by guide element sensors 1052. At step 1234, the position of the ribbon may be forward advanced based on the monitored position. Optionally, at step 1236, the position of the ribbon may be reverse advanced based on the monitored position. Thus, the ribbon may be advanced (e.g., forward or reversed advanced) as needed such that an appropriate region of the ribbon is properly aligned, for example, with respect to a transfer device (e.g., thermal transfer device 1042 or pressure transfer device 1044).

Figure 14:
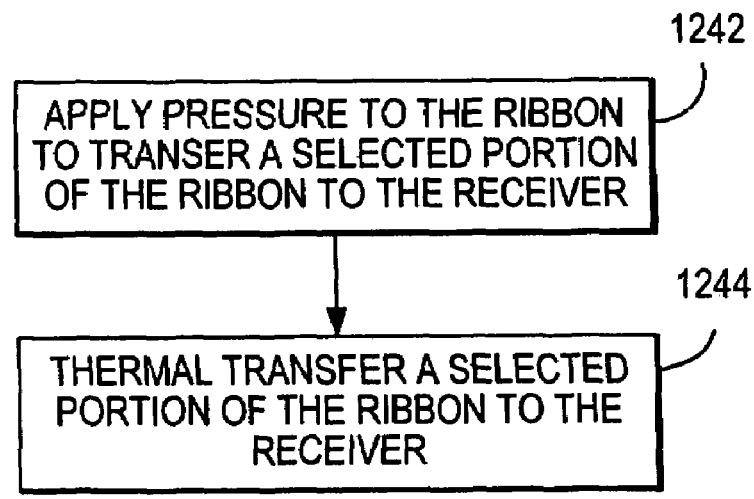
FIG. 14 is a flowchart illustrating with more detail a transfer printing step shown in FIG. 12 in accordance with the principles of the present invention.

Referring back to FIG. 12, at step 1240, the process may selectively transfer portions of the ribbon to a receiver at the predetermined position. FIG. 14 shows illustrative steps that may be performed at step 1240. For example, at step 1242, pressure may be applied to the ribbon to transfer a selected portion of the ribbon to the receiver. At step 1244, a selected portion of the ribbon may be thermally transferred to the ribbon. Returning back to FIG. 12, at step 1250, a determination is made as to whether printing is complete—that is, all indicia forming the label have been transferred to the receiver. Assuming that printing is not complete, the process may loop back to step 1230. Assuming that printing is complete, the process may end.

Persons skilled in the art will appreciate that the steps shown in FIGS. 12, 13, and 14 are merely illustrative and that additional steps may be added or steps may be omitted. For example, steps for feeding the receiver or testing operation of the label or indicia thereof may be added. As another example, step 1236 (of FIG. 13) may be omitted.

Figure 15:
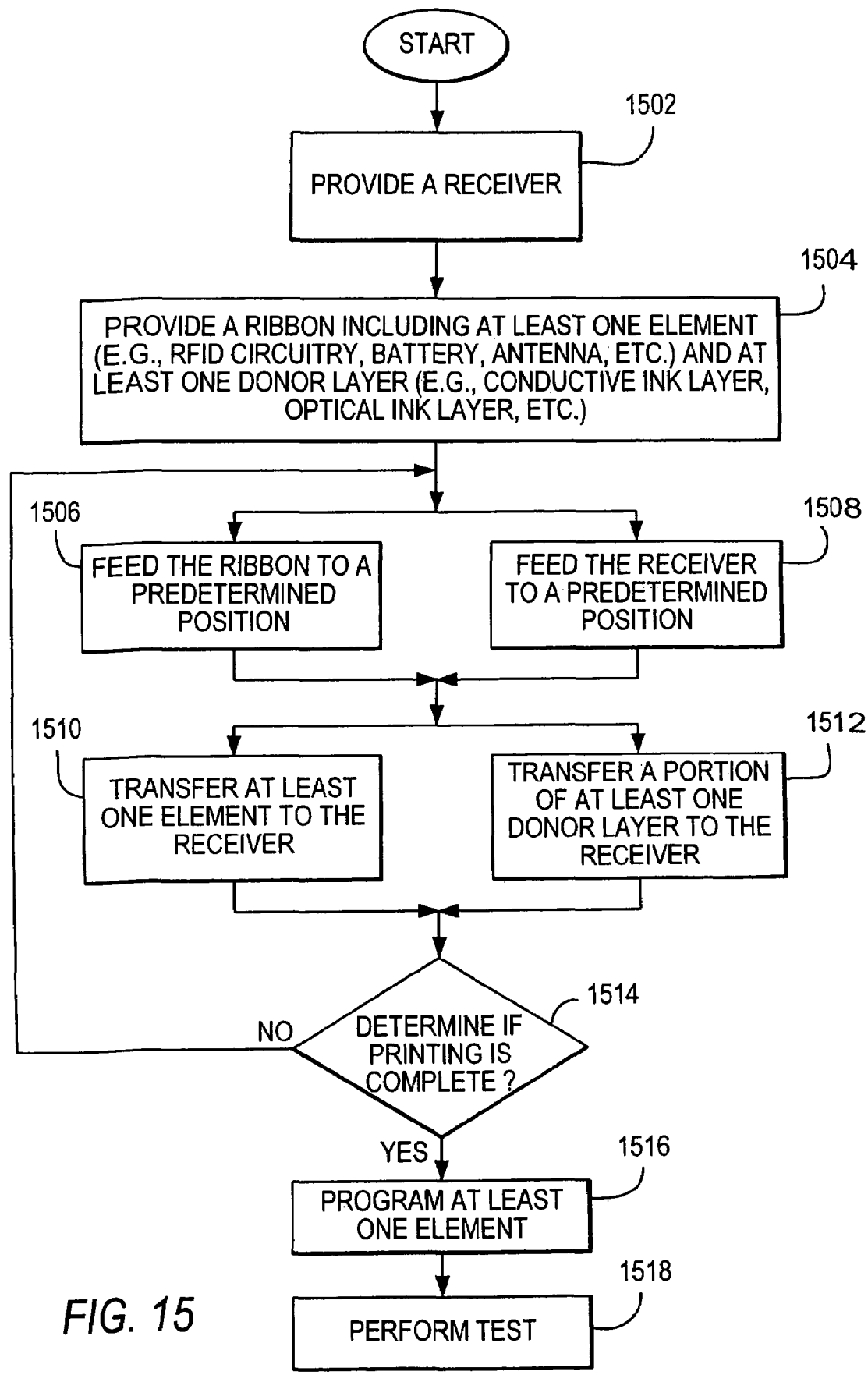
FIG. 15 shows an alternative flowchart for printing indicia in accordance with the principles of the present invention.

FIG. 15 shows another flowchart illustrating a process for printing indicia in accordance with the principles of the present invention. The process shown in FIG. 15 is similar to that shown in FIG. 12, but shows with more particularity an embodiment that may be practiced by the present invention. Beginning at step 1502, a receiver is provided. The receiver may be driven by receiver drive unit 1062 according to control signals provided by, for example, control circuitry 1008. At step 1504, a ribbon including at least one element (e.g., RFID circuitry, battery, antenna, etc.) and at least one donor layer (e.g., conductive ink layer, optical ink layer, etc.) may be provided. The ribbon may be driven by ribbon drive unit 1054 according to control signals provided by, for example, control circuitry 1008. In fact, ribbon drive unit 1054 and receiver drive unit 1062 may coordinate the feed of the ribbon and the receiver, respectively, to ensure proper printing. At step 1506, the ribbon may be fed to a predetermined position and at step 1508, the receiver may be fed to a predetermined position. Steps 1506 and 1508 are shown side-by-side to illustrate that the ribbon and the receiver may be simultaneously fed. Though, those of skill in the art will appreciate that that the ribbon and the receiver may be fed independent each other. For example, there may be instances where the ribbon is advanced, but not the receiver. This may occur, for example, when multiple layers and/or elements are being printed onto the same location on the receiver.

The process may advance to either one or both of steps 1510 and 1512, depending on which portions of the ribbon require printing at a given predetermined position of the ribbon and/or the receiver. At step 1510, at least one element (e.g., RFID circuitry or battery) of the ribbon may be transferred to the receiver. At step 1512, a portion of at least one donor layer may be transferred to the receiver. Any suitable means may be employed to effect transfer of the element or donor layer to the receiver. In a preferred embodiment, however, elements may be transferred by a pressure transfer device (e.g., pressure transfer device 1044) and donor layers may be transferred by a thermal transfer device (e.g., thermal transfer device 1042). The transfer of elements and donor layers may occur simultaneously or independently of each other.

At step 1514, a determination is made as to whether printing is complete. If printing is not complete, the process loops back to steps 1506 and 1508 to enable further feeding of the ribbon and/or receiver and transferring of elements or donor layers or both. If printing is complete, the process may proceed to step 1516, where at least one of the elements (e.g., RFID circuitry) may be programmed. For example, an element such as RFID circuitry may be programmed to emit predetermined data fit for the purpose for which the label is used. At step 1518, testing may be performed. The testing may include determining whether a particular element (e.g., RFID circuitry or battery) operates properly or whether the label operates properly.

It is understood that the steps shown in FIG. 15 are merely illustrative and that the order in which certain steps are executed may be rearranged, that steps may be added, and that steps may be omitted. For example, programming step 1516 may be executed before the programmable element is transferred to the receiver at step 1510. Moreover, testing of, for example, the programmable element may also be performed prior to being transferred to the receiver.

Figure 16:
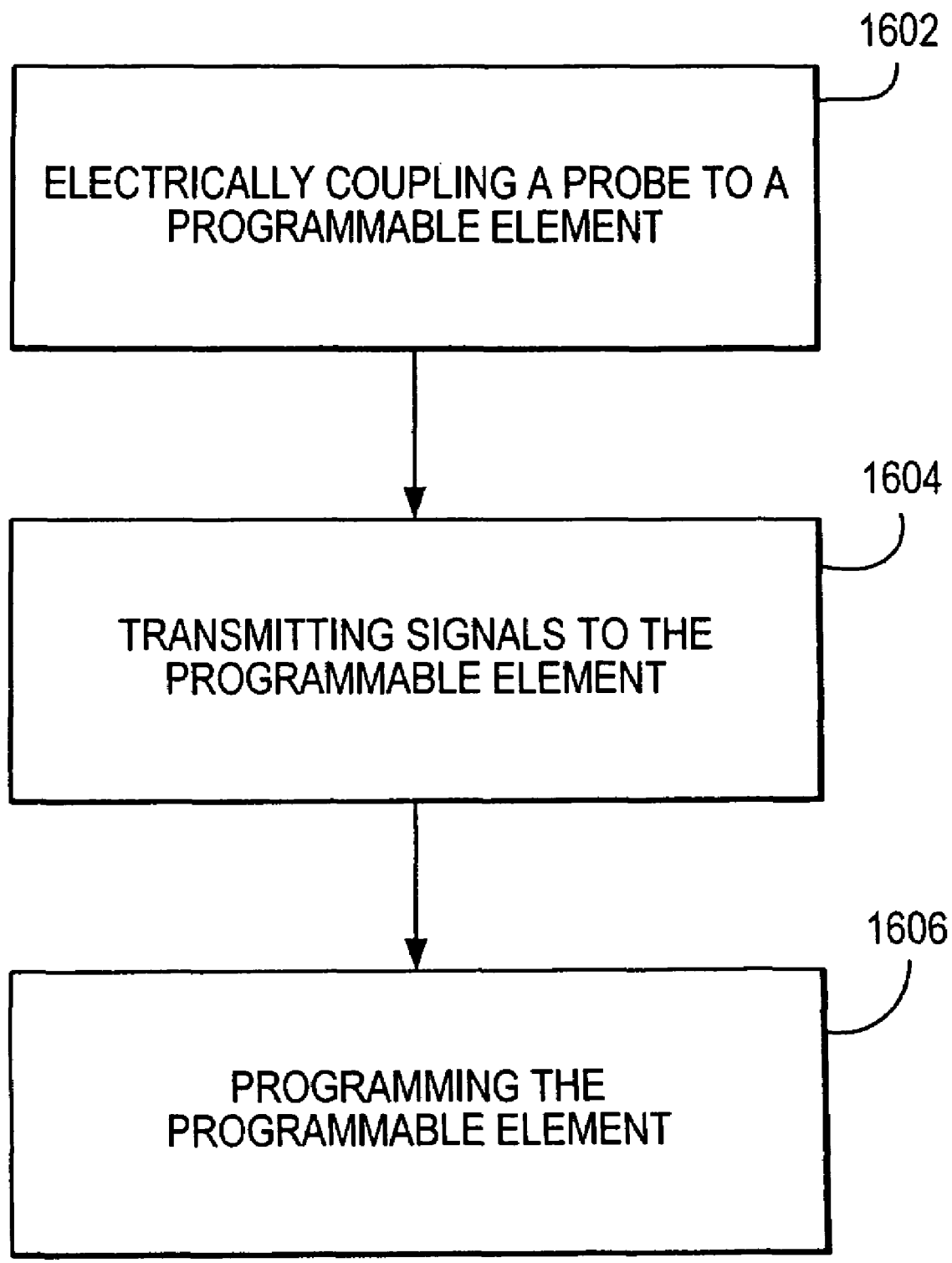
FIG. 16 shows a flowchart for performing tests in accordance with the principles of the present invention.

FIG. 16 shows a flowchart illustrating a process for programming a programmable element in accordance with the principles of the present invention. Programming of a programmable element or circuitry (e.g., RFID circuitry) may occur at any point in the process for producing labels in accordance with the invention. For example, programming may occur before, during, or after the element or circuitry is transferred to the receiver. Regardless of when the programmable element is programmed, the process for programming the element may start at step 1602 by electrically coupling a probe to a programmable element. The coupling may be any coupling capable of transmitting signals to the programmable element, as shown in step 1604. For example, the coupling may be a physical connection or a wireless connection. At step 1606, the programmable element is programmed with the transmitted signals.

Another aspect of the invention is that tests may be performed at any point during the label printing process. For example, testing may occur before, during, or after the element or circuitry is transferred to the receiver. Testing can verify, for example, whether the label operates properly. Such a test may monitor the RF signal emitted by the label and determine whether the RF signal includes data that meets predetermined criteria. If the label actively emits a radio frequency signal (because it may be powered by a battery), testing may be accomplished by monitoring the radio signal. If the label passively emits a radio signal in response to an activation signal, testing of such a label may include the transmission of that activation signal to incite emission of the label's radio signal and monitoring of the radio signal.

Another test may be performed to ensure that physical connections, resulting from the printing of conductive donor layers, between elements are satisfactory. Such tests may determine whether an antenna is connected to the RFID circuitry or whether a battery is connected to the RFID circuitry. Other tests may be performed to verify whether each element is functioning properly. The testing of individual elements may be performed while the element resides on the ribbon or when the element has been transferred to a receiver.

Testing may be performed through the use of a probe that may or may not be physically coupled to the label or indicia. For example, a probe such as probe 1033 of FIG. 11 may be used to perform tests in accordance with the principles of the invention.

Thus it is seen that customizable labels having electronic circuitry can be produced using the systems and methods according the present invention. A person skilled in the art will appreciate that the present invention can be practiced by other than the described embodiments, which are presented for purposes of illustration rather than of limitation, and the present invention is limited only by the claims which follow.

What is claimed is:

1. A method for printing and testing an indicium in conjunction with producing a label, the method comprising:
   selectively transfer printing indicia, at least one of which comprises programmable circuitry and another comprises conductive ink, to a receiver based on predetermined criteria;
   using a probe to monitor at least one indicium of the indicia; and
   determining whether the at least one indicium meets the predetermined criteria.

2. The method defined in claim 1, further comprising:
   obtaining the predetermined criteria prior to selectively transfer printing the indicia.

3. The method defined in claim 1, further comprising:
   using the probe to monitor the operation of the at least one indicium; and
   determining whether the monitored operation meets the predetermined criteria.

4. The method defined in claim 3, wherein the at least one indicium is an element, a tangible element, a printed element, a programmable element, radio frequency identification (RFID) circuitry, a battery, or a conductor.

5. The method defined in claim 1, wherein using a probe to monitor at least one indicium of the indicia comprises:
   applying signals to the at least one indicium to test the operation of the at least one indicium.

6. A method for printing and testing elements in conjunction with producing a label, the method comprising:

selectively transfer printing an element and a conductive layer to a receiver based on predetermined criteria;
coupling a probe to the element; and
monitoring the element via the probe to determine whether it operates according to the predetermined criteria.

7. The method defined in claim 6, wherein monitoring comprises:
transmitting signals to the element; and
receiving signals from the element.

8. The method defined in claim 6, wherein the the element is transfer printed to the receiver in a specific location based on the predetermined criteria.

9. The method defined in claim 6, wherein the conductive layer is transfer printed to the receiver in a specific pattern based on the predetermined criteria.

10. The method defined in claim 6 further comprising:
receiving the predetermined criteria prior to selectively transfer printing the element and the conductive layer.

11. The method defined in claim 6, wherein the element is radio frequency identification (RFID) circuitry.

12. A method for printing and programming elements in conjunction with producing a label, the method comprising:
selectively transfer printing a programmable element and a conductive layer to a receiver based on predetermined criteria;
coupling a probe to the programmable element; and
using the probe to transmit signals that program the programmable element based on the predetermined criteria.

13. The method defined in claim 12, wherein the programmable element is transfer printed to the receiver in a specific location based on the predetermined criteria.

14. The method defined in claim 12, wherein the conductive layer is transfer printed to the receiver in a specific pattern based on the received criteria.

15. The method defined in claim 12, wherein:
the programmable element is transfer printed to the receiver in a specific location based on the received criteria;
the conductive layer is transfer printed to the receiver in a specific pattern based on the received criteria; and
the specific location and the specific pattern are such that the programmable element and the conductive layer are electrically coupled together.

16. The method defined in claim 12, further comprising:
receiving the predetermined criteria prior to selectively transfer printing the programmable element and the conductive layer.

17. The method defined in claim 12, wherein the programmable element is radio frequency identification (RFID) circuitry.

18. The method defined in claim 12, wherein the transmitted signals instruct the programmable element to store predetermined data.

19. A method for printing, programming, and testing the operation of radio frequency identification (RFID) circuitry in conjunction with producing a label on demand in a printing system, the method comprising:
selectively transfer printing RFID circuitry and a conductive layer to a receiver based on predetermined criteria;
temporarily coupling a probe to the RFID circuitry;
applying signals, using the probe, to the RFID circuitry;
programming the RFID circuitry with the applied signals based on the predetermine criteria; and
monitoring a radio signal emitted by the RFID circuitry to verify whether the RFID circuitry has been programmed successfully.

20. The method defined in claim 19, wherein the RFID circuitry emits programmed data via a radio signal in response to an activation signal, the method further comprising:
transmitting an activation signal to the RFID circuitry to cause the RFID circuitry to emit a radio signal that comprises programmed data.

21. The method defined in claim 19, wherein the monitored radio signal comprises programmed data.

22. A system for printing and testing indicium in conjunction with producing a label, the system comprising:
control circuitry;
a printing mechanism, coupled to and controlled by the control circuitry, operative to selectively transfer print indicia, at least one of which comprises programmable circuitry and another comprises conductive ink, to a receiver based on predetermined criteria; and
a probe, coupled to and controlled by the control circuitry, operative to monitor at least one indicium of the indicia, wherein the control circuitry determines whether the at least one indicium meets the predetermined criteria.

23. The system defined in claim 22, further comprising:
an input source coupled to the control circuitry and operative to receive the predetermined criteria.

24. The system defined in claim 22, wherein the control circuitry is operative to:
use the probe to monitor the operation of the at least one indicium; and
determine whether the operation of the at least one indicium meets the predetermined criteria.

25. The system defined in claim 24, wherein the at least one indicium is an element, a tangible element, a printed element, a programmable element, radio frequency identification (RFID) circuitry, a battery, or a conductor.

26. The system defined in claim 22, wherein the control circuitry is operative to:
cause the probe to apply signals to the at least one indicium to test the operation of the at least one indicium.

27. A system for printing and testing elements in conjunction with producing a label, the system comprising:
control circuitry;
a printing mechanism, coupled to and controlled by the control circuitry, operative to selectively transfer print an element and a conductive layer to a receiver based on predetermined criteria; and
a probe coupled to the control circuitry and operative to test the operation of the element, wherein the control circuitry determines whether the element operates according to the predetermined criteria.

28. The system defined in claim 27, wherein the control circuitry is operative to:
cause the probe to transmit signals to the element; and
use the probe to receive signals from the element.

29. The system defined in claim 27, wherein the printing mechanism is operative to transfer print the element to the receiver in a specific location based on the predetermined criteria.

30. The system defined in claim 27, wherein the printing mechanism is operative to transfer print the conductive layer to the receiver in a specific pattern based on the predetermined criteria.

31. The system defined in claim 27, further comprising:
an input source coupled to the control circuitry and operative to receive the predetermined criteria.

32. The system defined in claim 27, wherein the element is radio frequency identification (RFID) circuitry.

33. A printing system for printing and programming elements in conjunction with producing a label, the system comprising:
  control circuitry;
  a printing mechanism, coupled to and controlled by the control circuitry, operative to selectively transfer print a programmable element and a conductive layer to a receiver based on predetermined criteria; and
  a probe coupled to the control circuitry and selectively coupled to the programmable element, wherein the control circuitry is operative to use the probe to transmit signals that program the programmable element based on the predetermined criteria when the probe is coupled to the programmable element.

34. The system defined in claim 33, wherein the printing mechanism is operative to selectively transfer print the programmable element to the receiver in a specific location based on the predetermined criteria.

35. The system defined in claim 33, wherein the printing mechanism is operative to selectively transfer print the conductive layer to the receiver in a specific pattern based on the predetermined criteria.

36. The system defined in claim 33, wherein:
  the printing mechanism is operative to transfer print the programmable element to the receiver in a specific location based on the predetermined criteria;
  the printing mechanism is operative to transfer print the conductive layer to the receiver in a specific pattern based on the predetermined criteria; and
  the specific location and the specific pattern are such that the programmable element and the conductive layer are electrically coupled together.

37. The system defined in claim 33, further comprising:
  an input source coupled to the control circuitry and operative to receive the predetermined criteria.

38. The system defined in claim 33, wherein the programmable element is radio frequency identification (RFID) circuitry.

39. The system defined in claim 33, wherein the transmitted signals instruct the programmable element to store predetermined data.

40. A printing system for printing, programming, and testing the operation of radio frequency identification (RFID) circuitry in conjunction with producing a label on demand, the system comprising:
  control circuitry;
  a printing mechanism, coupled to and controlled by the control circuitry, operative to selectively transfer print RFID circuitry and a conductive layer to a receiver based on predetermined criteria; and
  a probe coupled to the control circuitry, the probe operative under the control of the control circuitry to:
    apply signals to the RFID circuitry;
    program the RFID circuitry with the applied signals based on the predetermined criteria; and
    monitor a radio signal emitted by the RFID circuitry to verify whether the RFID circuitry has been programmed successfully.

41. The system defined in claim 40, wherein the RFID circuitry emits programmed data via a radio signal in response to an activation signal, the probe is further operative to:
  transmit an activation signal to the RFID circuitry to cause the RFID circuitry to emit a radio signal that comprises programmed data.

42. The system defined in claim 40, wherein the monitored radio signal comprises programmed data.

* * * * *